(12) United States Patent  (10) Patent No.: US 12,309,996 B2
Chu  (45) Date of Patent: *May 20, 2025

(54) SEMICONDUCTOR DEVICE WITH ETCHED LANDING PAD SURFACE

(71) Applicant: NANYA TECHNOLOGY CORPORATION, New Taipei (TW)

(72) Inventor: Yen-Ho Chu, Hsinchu (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 428 days.

This patent is subject to a terminal disclaimer.

(21) Appl. No.: 17/863,493

(22) Filed: Jul. 13, 2022

(65) Prior Publication Data

US 2024/0023307 A1    Jan. 18, 2024

(51) Int. Cl.
*H10B 12/00* (2023.01)
*H01L 21/768* (2006.01)
*H01L 23/528* (2006.01)

(52) U.S. Cl.
CPC ..... *H10B 12/0335* (2023.02); *H01L 21/7682* (2013.01); *H01L 21/76837* (2013.01); *H01L 23/5283* (2013.01); *H10B 12/315* (2023.02); *H10B 12/482* (2023.02); *H10B 12/485* (2023.02)

(58) Field of Classification Search
CPC .............. H10B 12/0335; H10B 12/315; H10B 12/482; H10B 12/485; H10B 12/48; H01L 21/7682; H01L 21/76837; H01L 23/5283; H01L 21/76883; H01L 21/76834; H01L 21/76897
See application file for complete search history.

(56) References Cited

U.S. PATENT DOCUMENTS 10,373,960 B2   8/2019   Kim et al.
2020/0365537 A1  11/2020  Choi et al.
2022/0102528 A1* 3/2022  Kim .................... H01L 29/4236

FOREIGN PATENT DOCUMENTS

TW            202215643 A     4/2022

OTHER PUBLICATIONS

Office Action and Search Report mailed on Apr. 10, 2024 related to Taiwanese Application No. 112120071.
Office Action and and the search report mailed on Nov. 21, 2024 related to U.S. Appl. No. 18/218,212.

* cited by examiner

*Primary Examiner* — John P. Dulka
(74) *Attorney, Agent, or Firm* — Xuan Zhang

(57) ABSTRACT

A semiconductor device and method for manufacturing the same are provided. The semiconductor device includes a substrate, a bit line, a first isolation spacer, a second isolation spacer, a capacitor contact, a landing pad, and a dielectric structure. The bit line is disposed on the substrate. The first isolation spacer is disposed on a first side of the bit line. The second isolation spacer is disposed on a second side of the bit line. The capacitor contact is disposed on the substrate and spaced apart from the bit line through the first isolation spacer. The landing pad is disposed on the first isolation spacer and electrically connected to the capacitor contact. The dielectric structure is disposed on the second isolation contact. A top surface of the dielectric structure is non-coplanar with a top surface of the landing pad.

17 Claims, 20 Drawing Sheets

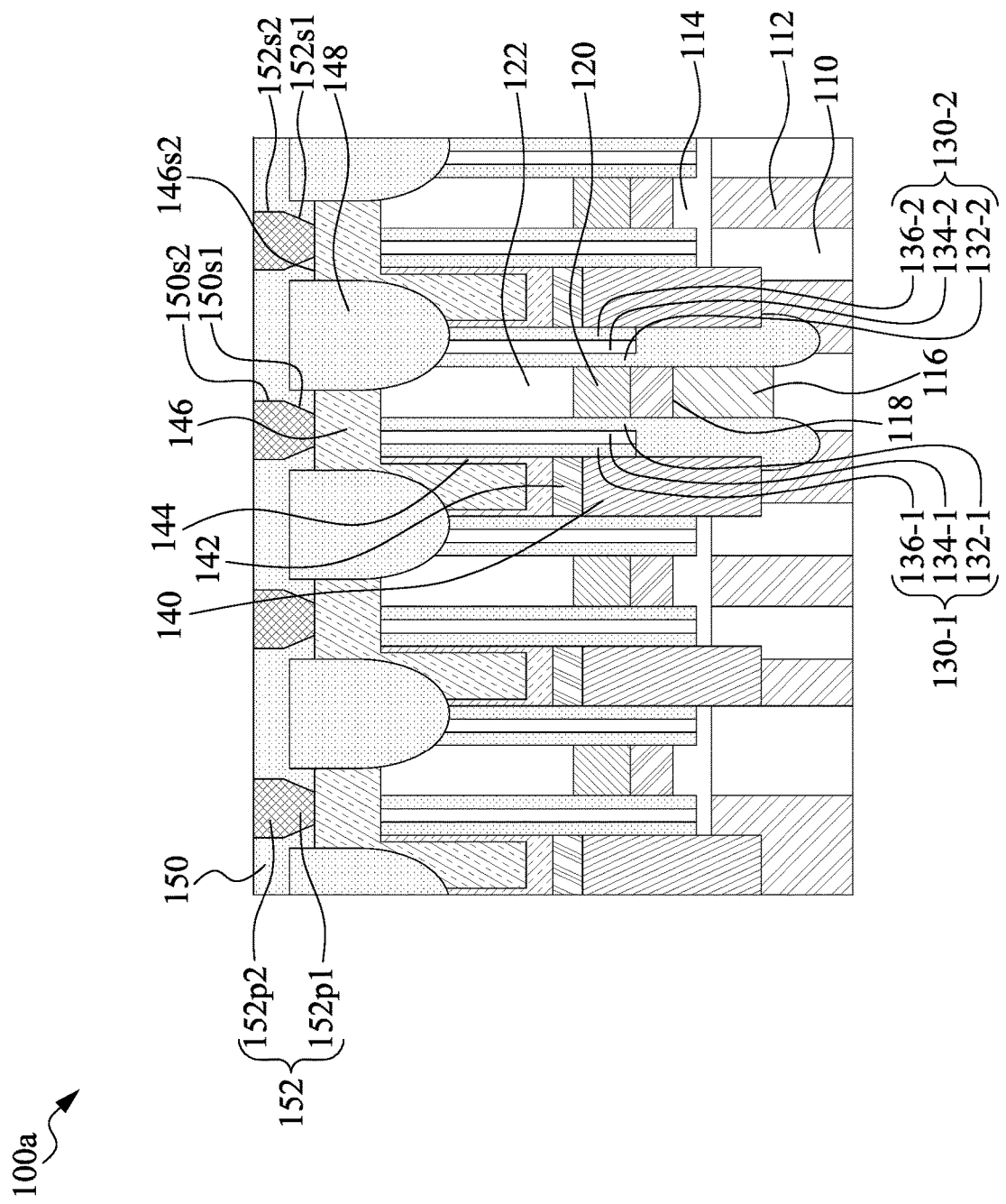

SEMICONDUCTOR DEVICE WITH ETCHED LANDING PAD SURFACE

TECHNICAL FIELD

The present disclosure relates to a semiconductor device and method for manufacturing the same, and more particularly, to a semiconductor device including a landing pad with a top surface recessed from a dielectric structure and method for manufacturing the same.

DISCUSSION OF THE BACKGROUND

With integrated circuits (ICs) achieving regular increases in performance and miniaturization, advances in materials and design produce successive generations with smaller and more complex circuits.

As the semiconductor industry develops, reducing overlay errors in lithography operations is becoming much more important. For example, when defining a pattern of a conductive wire to connect a landing pad, a relatively great overlay error can result in the conductive wire being misaligned with the landing pad, which may cause the material of the conductive wire to fill the air gap of an isolation spacer and negatively affect the electrical parameter of the a semiconductor device. Therefore, a new semiconductor device and method of improving such problems is required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a bit line, a first isolation spacer, a second isolation spacer, a capacitor contact, a landing pad, and a dielectric structure. The bit line is disposed on the substrate. The first isolation spacer is disposed on a first side of the bit line. The second isolation spacer is disposed on a second side of the bit line. The capacitor contact is disposed on the substrate and spaced apart from the bit line through the first isolation spacer. The landing pad is disposed on the first isolation spacer and electrically connected to the capacitor contact. The dielectric structure is disposed on the second isolation contact. A top surface of the dielectric structure is non-coplanar with a top surface of the landing pad.

Another aspect of the present disclosure provides another semiconductor device. The semiconductor device includes a substrate, a bit line, a first isolation spacer, a second isolation spacer, a capacitor contact, a landing pad, and a conductive wire. The bit line is disposed on the substrate. The first isolation spacer is disposed on a first side of the bit line. The second isolation spacer is disposed on a second side of the bit line. The capacitor contact is disposed on the substrate and spaced apart from the bit line through the first isolation spacer. The landing pad is disposed on the first isolation spacer and electrically connected to the capacitor contact. The conductive wire is electrically connected to the landing pad. The conductive wire has a first sidewall connected to the landing pad and a second sidewall spaced apart from the landing pad through the first sidewall. The first sidewall is non-coplanar with the second sidewall.

Another aspect of the present disclosure provides a method of manufacturing a semiconductor device. The method includes providing a substrate, forming a bit line over the substrate, forming a first isolation spacer on a first side of the bit line and a second isolation spacer on a second side of the bit line, forming a capacitor contact on the substrate, wherein the capacitor contact is spaced apart from the bit line by the first isolation spacer, forming a landing pad on the capacitor contact and the first isolation spacer, forming a dielectric structure on the second isolation spacer, removing a portion of the landing pad to form a recessed from a top surface of the landing pad, and forming a conductive wire on the landing pad.

In some embodiments, forming the isolation spacer comprises: forming an air gap within the first isolation spacer.

In some embodiments, forming the air gap comprises: forming a first dielectric layer on the first side of the bit line; forming a second dielectric layer on the first dielectric layer; forming a third dielectric layer on the first dielectric layer; and removing the second dielectric layer to form the air gap between the first dielectric layer and the third dielectric layer.

In some embodiments, the method further comprises: forming an overlay correction layer to fill the recess of the landing pad, wherein the overlay correction layer has a recess vertically aligned with the recess of the landing pad.

In some embodiments, the method further comprises: forming a trench of the overlay correction layer to expose the top surface of the landing pad, wherein the conductive wire is formed within the trench of the overlay correction layer.

In some embodiments, the overlay correction layer has a thickness, the recess has a stepped difference between the landing pad and the dielectric structure, and the stepped difference ranges from about 0.03 times to about 0.5 times the thickness of the overlay correction layer.

In some embodiments, the conductive wire has a first sidewall connected to the landing pad and a second sidewall spaced apart from the landing pad through the first sidewall, and the first sidewall is non-coplanar with the second sidewall.

The embodiments of the present disclosure illustrate a semiconductor device including a landing pad with a top surface recessed from a top surface of the dielectric structure. The overlay correction layer can cover the recessed top surface of the landing pad and define a recess aligned with the landing pad, which may assist in identification of the charge-coupled device (CCD) during the lithography process. As a result, device yield can be enhanced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 4O illustrates one or more stages of an exemplary method for manufacturing a semiconductor device according to some embodiments of the present disclosure.

DETAILED DESCRIPTION

Figure 1A:
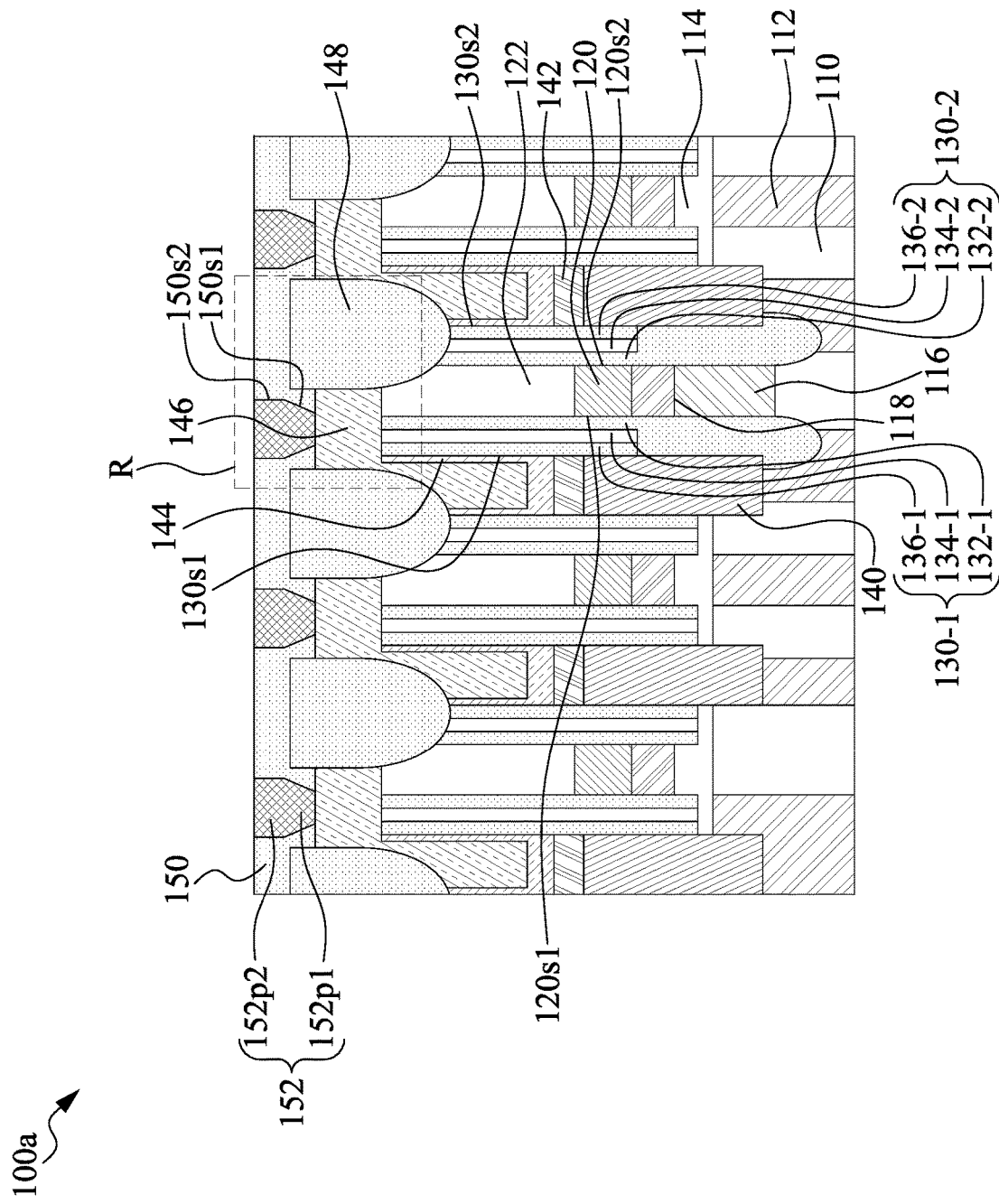
FIG. 1A is a cross-sectional view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A is a cross-sectional view of a semiconductor device 100a, in accordance with some embodiments of the present disclosure. In some embodiments, the semiconductor device 100a can include a cell region in which a memory device is formed. The memory device can include, for example, a dynamic random access memory (DRAM) device, a one-time programming (OTP) memory device, a static random access memory (SRAM) device, or other suitable memory devices. In some embodiments, a DRAM can include, for example, a transistor, a capacitor, and other components. During a read operation, a word line can be asserted, turning on the transistor. The enabled transistor allows the voltage across the capacitor to be read by a sense amplifier through a bit line. During a write operation, the data to be written can be provided on the bit line when the word line is asserted.

In some embodiments, the semiconductor device 100a can include a peripheral region (not shown) utilized to form a logic device (e.g., system-on-a-chip (SoC), central processing unit (CPU), graphics processing unit (GPU), application processor (AP), microcontroller, etc.), a radio frequency (RF) device, a sensor device, a micro-electro-mechanical-system (MEMS) device, a signal processing device (e.g., digital signal processing (DSP) device)), a front-end device (e.g., analog front-end (AFE) devices) or other devices.

The semiconductor device 100a can include a substrate 110. The substrate 110 may be a semiconductor substrate, such as a bulk semiconductor, a semiconductor-on-insulator (SOI) substrate, or the like. The substrate 110 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 110 may have a multilayered structure, or the substrate 110 may include a multilayered compound semiconductor structure.

In some embodiments, the substrate 110 can include a plurality of active areas. The active area can function as, for example, a channel for electrical connection.

In some embodiments, the semiconductor device 100a can include isolation structures 112. In some embodiments, the plurality of active areas can be separated by the isolation structures 112. In some embodiments, the isolation structure 112 can be embedded in the substrate 110. In some embodiments, the isolation structure 112 can include, for example, silicon oxide ($SiO_2$), silicon nitride ($Si_3N_4$), silicon oxynitride ($N_2OSi_2$), silicon nitride oxide ($N_2OSi_2$), or other suitable materials.

In some embodiments, the semiconductor device 100a can include a dielectric layer 114. The dielectric layer 114 can be disposed on the substrate 110. In some embodiments, the dielectric layer 114 can cover a portion of the isolation structure 112. In some embodiments, the dielectric layer 114 can include, for example, silicon oxide ($SiO_2$), silicon nitride ($Si_3N_4$), silicon oxynitride ($N_2OSi_2$), silicon nitride oxide ($N_2OSi_2$), a high-k material or combinations thereof. Examples of the high-k material include a dielectric material having a dielectric constant exceeding that of silicon dioxide ($SiO_2$), or a dielectric material having a dielectric constant higher than about 3.9. In some embodiments, the dielectric layer 114 can include at least one metallic element, such as hafnium oxide ($HfO_2$), silicon doped hafnium oxide (HSO), lanthanum oxide ($La_2O_3$), lanthanum aluminum oxide ($LaAlO_3$), zirconium orthosilicate ($ZrSiO_4$), aluminum oxide ($Al_2O_3$) or combinations thereof.

In some embodiments, the semiconductor device 100a can include a bit line contact 116. In some embodiments, the bit line contact 116 can be disposed on the active area of the substrate 110. The bit line contact 116 can include metal, such as tungsten (W), copper (Cu), ruthenium (Ru), iridium (Ir), nickel (Ni), osmium (Os), ruthenium (Rh), aluminum (Al), molybdenum (Mo), cobalt (Co), alloys thereof, combinations thereof or any metallic material with suitable resistance and gap-fill capability.

In some embodiments, the semiconductor device 100a can include bit line stacks 118. In some embodiments, the bit line stack can include a multilayered structure. In some embodiments, a portion of the bit line stacks 118 can be disposed on the bit line contact 116. In some embodiments, a portion of the bit line stacks 118 can be in contact with the bit line contact 116. In some embodiments, a portion of the bit line stacks 118 can be electrically connected to the bit line contact 116. In some embodiments, a portion of the bit line stacks 118 can be disposed on the dielectric layer 114. In some embodiments, a portion of the bit line stacks 118 can be in contact with the dielectric layer 114. The bit line stack 118 can include titanium (Ti), tantalum (Ta), titanium nitride (TiN), tantalum nitride (TaN), manganese nitride (MnN) or a combination thereof.

In some embodiments, the semiconductor device 100a can include bit lines 120. In some embodiments, each of the bit lines 120 can be disposed on the bit line stack 118. In some embodiments, a portion of the bit lines 120 can be disposed on the bit line contact 116. In some embodiments, a portion of the bit lines 120 can be electrically connected to the bit line contact 116. In some embodiments, a portion of the bit lines 120 can be disposed on the dielectric layer 114. The bit line 120 can include metal, such as tungsten (W), copper (Cu), ruthenium (Ru), iridium (Ir), nickel (Ni), osmium (Os), ruthenium (Rh), aluminum (Al), molybdenum (Mo), cobalt (Co), alloys thereof, or combinations thereof.

In some embodiments, the semiconductor device 100a can include dielectric layers 122. In some embodiments, each of the dielectric layers 122 can be disposed on the bit line 120. In some embodiments, the dielectric layer 122 can include, for example, silicon oxide, silicon nitride, silicon oxynitride, silicon nitride oxide, a high-k material or combinations thereof.

In some embodiments, the semiconductor device 100a can include isolation spacers 130-1 and 130-2. The isolation spacer 130-1 can be disposed on a sidewall 120s1 of the bit line 120. The isolation spacer 130-2 can be disposed on a sidewall 120s2 of the bit line 120. It should be noted that although FIG. 1A illustrates the isolation spacers 130-1 and 130-2 separated in a cross-section, the isolation spacers 130-1 and 130-2 can be a part of an integral (or monolithic) structure, with said integral structure having a circular profile, an elliptical profile, or the like from a top view.

In some embodiments, the isolation spacer 130-1 can have a dielectric layer 132-1, an air gap 134-1, and a dielectric layer 136-1. In some embodiments, the isolation spacer 130-2 can have a dielectric layer 132-2, an air gap 134-2, and a dielectric layer 136-2. In some embodiments, the dielectric layers 132-1 and 132-2 can be formed on the sidewalls of the bit line contact 116, the bit line stack 118, the bit line 120, and the dielectric layer 122. For example, the dielectric layer 132-1 can be formed on the sidewall 120s1 of the bit line 120, and the dielectric layer 132-2 can be formed on the sidewall 120s2 of the bit line 120. In some embodiments, the dielectric layer 132-1 can be in contact with the sidewall 120s1 of the bit line 120. In some embodiments, the dielectric layer 132-2 can be in contact with the sidewall 120s2 of the bit line 120. In some embodiments, a portion of the dielectric layer 132-1 can be embedded in the substrate 110. In some embodiments, a portion of the dielectric layer 132-2 can be embedded in the substrate 110.

In some embodiments, the air gap 134-1 can be spaced apart from the bit line 120 by the dielectric layer 132-1. In some embodiments, the air gap 134-2 can be spaced apart from the bit line 120 by the dielectric layer 132-2. In some embodiments, the air gap 134-1 can be disposed between the dielectric layers 132-1 and 136-1. In some embodiments, the air gap 134-2 can be disposed between the dielectric layers 132-2 and 136-2.

In some embodiments, the dielectric layer 136-1 can be disposed on the dielectric layer 132-1. In some embodiments, the dielectric layer 136-2 can be disposed on the dielectric layer 132-2. In some embodiments, each of the dielectric layers 132-1, 132-2, 136-1 and/or 136-2 can include, for example, silicon oxide, silicon nitride, silicon oxynitride, silicon nitride oxide, a high-k material or combinations thereof.

In some embodiments, the semiconductor device 100a can include a capacitor contact 140. In some embodiments, the capacitor contact 140 can be formed between two bit lines 120. In some embodiments, the capacitor contact 140 can be formed between the isolation spacers 130-1 and 130-2. In some embodiments, the capacitor contact 140 can be formed between the dielectric layers 136-1 and 136-2. In some embodiments, the capacitor contact 140 can be formed between a sidewall 130s1 of the isolation spacer 130-1 and a sidewall 130s2 of the isolation spacer 130-2. The capacitor contact 140 can include metal, such as tungsten (W), copper (Cu), ruthenium (Ru), iridium (Ir), nickel (Ni), osmium (Os), ruthenium (Rh), aluminum (Al), molybdenum (Mo), cobalt (Co), alloys thereof, combinations thereof or any metallic material.

In some embodiments, the semiconductor device 100a can include a conductive stack structure 142. The conductive stack structure 142 can include a multilayered structure. In some embodiments, the conductive stack structure 142 can be formed on a top surface of the capacitor contact 140. In some embodiments, the conductive stack structure 142 can include metal silicide, such as, cobalt silicide (CoSi) or other suitable materials.

In some embodiments, the semiconductor device 100a can include a liner 144. In some embodiments, the liner 144 can be formed on a top surface of the capacitor contact 140. In some embodiments, the liner 144 can be formed on the sidewall 130s1 of the isolation spacer 130-1. In some embodiments, the liner 144 can be formed on a sidewall of the dielectric layer 136-1. In some embodiments, the liner 144 can be formed on the sidewall 130s2 of the isolation spacer 130-2. In some embodiments, the liner 144 can be formed on a sidewall of the dielectric layer 136-2. In some embodiments, the liner 144 can include metal nitride, such as titanium nitride (TiN) or other suitable materials.

In some embodiments, the semiconductor device 100a can include landing pads 146. The landing pad 146 can be configured to electrically connect a capacitor structure (not shown). In some embodiments, the landing pad 146 can be formed on the liner 144. In some embodiments, the landing pad 146 can be formed between two bit lines 120. In some embodiments, the landing pad 146 can be formed between the isolation spacers 130-1 and 130-2. In some embodiments, the landing pad 146 can cover a top surface the isolation spacer 130-1. In some embodiments, the landing pad 146 can cover a top surface of the dielectric layer 132-1. In some embodiments, the landing pad 146 can cover a top surface of the dielectric layer 136-1. In some embodiments, the air gap 134-1 can be covered by the landing pad 146. In some embodiments, the landing pad 146 can cover a top surface the isolation spacer 130-2. In some embodiments, a portion of the landing pad 146 can be surrounded by the liner 144. In some embodiments, the landing pad 146 can cover a top surface of the dielectric layer 122. In some embodiments, the landing pad 146 can include metal, such as tungsten (W), copper (Cu), ruthenium (Ru), iridium (Ir), nickel (Ni), osmium (Os), ruthenium (Rh), aluminum (Al), molybdenum (Mo), cobalt (Co), alloys thereof, or combinations thereof.

In some embodiments, the semiconductor device 100a can include a dielectric structure 148. In some embodiments, the dielectric structure 148 can be formed on the isolation spacer 130-2. In some embodiments, the dielectric structure 148 can cover a top surface of the dielectric layer 132-2. In some embodiments, the dielectric structure 148 can cover a top surface of the dielectric layer 136-2. In some embodiments, the air gap 134-2 can be covered by the dielectric structure 148. In some embodiments, the dielectric structure 148 can be utilized to separate the landing pads 146. In some embodiments, the dielectric structure 148 can include, for example, silicon oxide, silicon nitride, silicon oxynitride, silicon nitride oxide, a high-k material or combinations thereof.

In some embodiments, the semiconductor device 100a can include an overlay correction layer 150. In some embodiments, the overlay correction layer 150 can cover the top surface of the dielectric structure 148. In some embodiments, the overlay correction layer 150 can cover the top surface of the landing pad 146. In some embodiments, the overlay correction layer 150 can include, for example, silicon oxide, silicon nitride, silicon oxynitride, silicon nitride oxide, a high-k material or combinations thereof.

In some embodiments, the semiconductor device 100a can include conducive wires 152. In some embodiments, the conductive wire 152 can be utilized to connect the landing pad 146 to a capacitor structure (not shown) above the conducive wires 152. In some embodiments, the conducive wire 152 can penetrate the overlay correction layer 150. In some embodiments, the conducive wire 152 can be electrically connected to the landing pad 146. In some embodiments, the conducive wire 152 can include conductive material, such as tungsten, zirconium oxide, or other suitable materials.

Figure 1B:
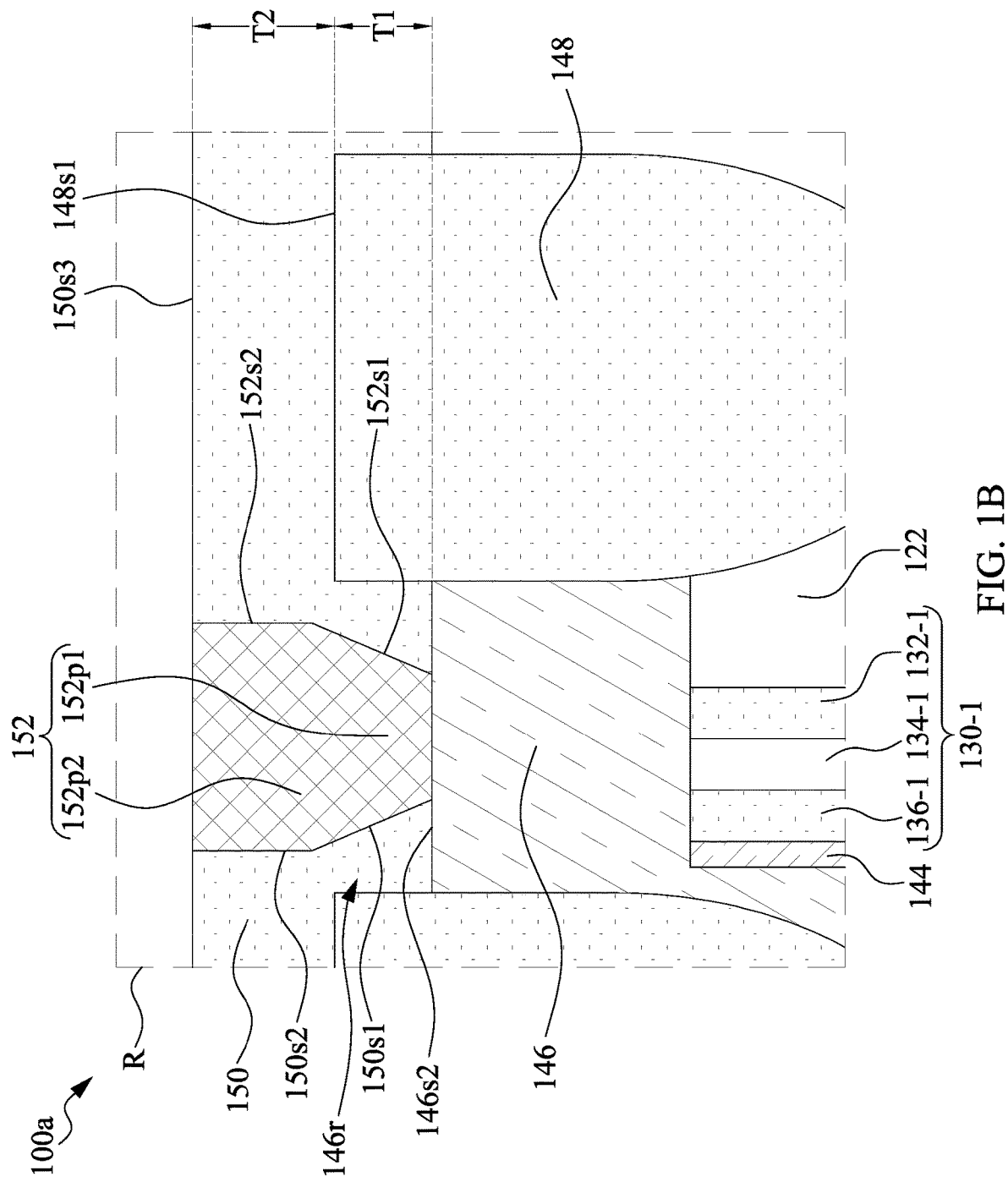
FIG. 1B is a partial enlarged view of a region R of the semiconductor device as shown in FIG. 1A, in accordance with some embodiments of the present disclosure.

FIG. 1B is a partial enlarged view of a region R of the semiconductor device 100a as shown in FIG. 1A, in accordance with some embodiments of the present disclosure.

In some embodiments, a surface 146s2 (or a top surface) of the landing pad 146 is recessed from a surface 148s1 (or a top surface) of the dielectric structure 148. In some embodiments, the surface 148s1 of the dielectric structure 148 is non-coplanar with the surface 146s2 of the landing pad 146.

The surface 146s2 of the landing pad 146 and the surface 148s1 of the dielectric structure 148 can define a stepped difference T1. The overlay correction layer 150 can have a thickness T2 over the dielectric structure 148. The thickness T2 may be defined as a distance between a surface 150s3 of the overlay correction layer 150 and the surface 148s1 of the dielectric structure 148. In some embodiments, the thickness T2 can exceed the stepped difference T1. In some embodiments, the stepped difference T1 can range from about 0.03 times to about 0.5 times the thickness T2, such as 0.03 times, 0.05 times, 0.1 times, 0.2 times, 0.3 times, 0.4 times, or 0.5 times.

In some embodiments, the overlay correction layer 150 can have a sidewall 150s1 and a sidewall 150s2. The sidewall 150s1 can extend from the surface 146s2 of the landing pad 146. The sidewall 150s2 can be spaced apart from the landing pad 146 by the sidewall 150s1 of the overlay correction layer 150. In some embodiments, the sidewall 150s1 of the overlay correction layer 150 can be non-coplanar with the sidewall 150s2 of the overlay correction layer 150. In some embodiments, the sidewall 150s2 of the overlay correction layer 150 can be steeper than the sidewall 150s1 of the overlay correction layer 150.

The conductive wire 152 can have a sidewall 152s1 and a sidewall 152s2. The sidewall 152s1 can extend from the surface 146s2 of the landing pad 146. The sidewall 152s2 can be spaced apart from the landing pad 146 by the sidewall 152s1 of the conductive wire 152. In some embodiments, the sidewall 152s1 of the conductive wire 152 can be non-coplanar with the sidewall 152s2 of the conductive wire 152.

In some embodiments, the sidewall 152s2 of the conductive wire 152 can be steeper than the sidewall 152s1 of the conductive wire 152.

The conductive wire 152 can have a portion 152p1 and a portion 152p2. In some embodiments, the taper angle (or angle of taper) of the portion 152p1 can be different from that of the portion 152p2. In some embodiments, the taper angle of the portion 152p2 can exceed that of the portion 152p1. In some embodiments, the taper angle of the portion 152p1 can be defined by the sidewall 150s1 of the overlay correction layer 150. In some embodiments, the taper angle portion 152p2 can be defined by the sidewall 150s2 of the overlay correction layer 150.

In this embodiment, the landing pad 146 has a recessed top surface (e.g., 146s2). The overlay correction layer 150 can cover the recessed top surface and have a recess aligned with the landing pad 146 during a manufacturing process, which will be described later. Such a recess of the overlay correction layer 150 may assist in identification of the charge-coupled device (CCD) during the lithography process, which thereby aligning the conductive wire 152 to the landing pad 146. As a result, device yield can be enhanced.

Figure 2:
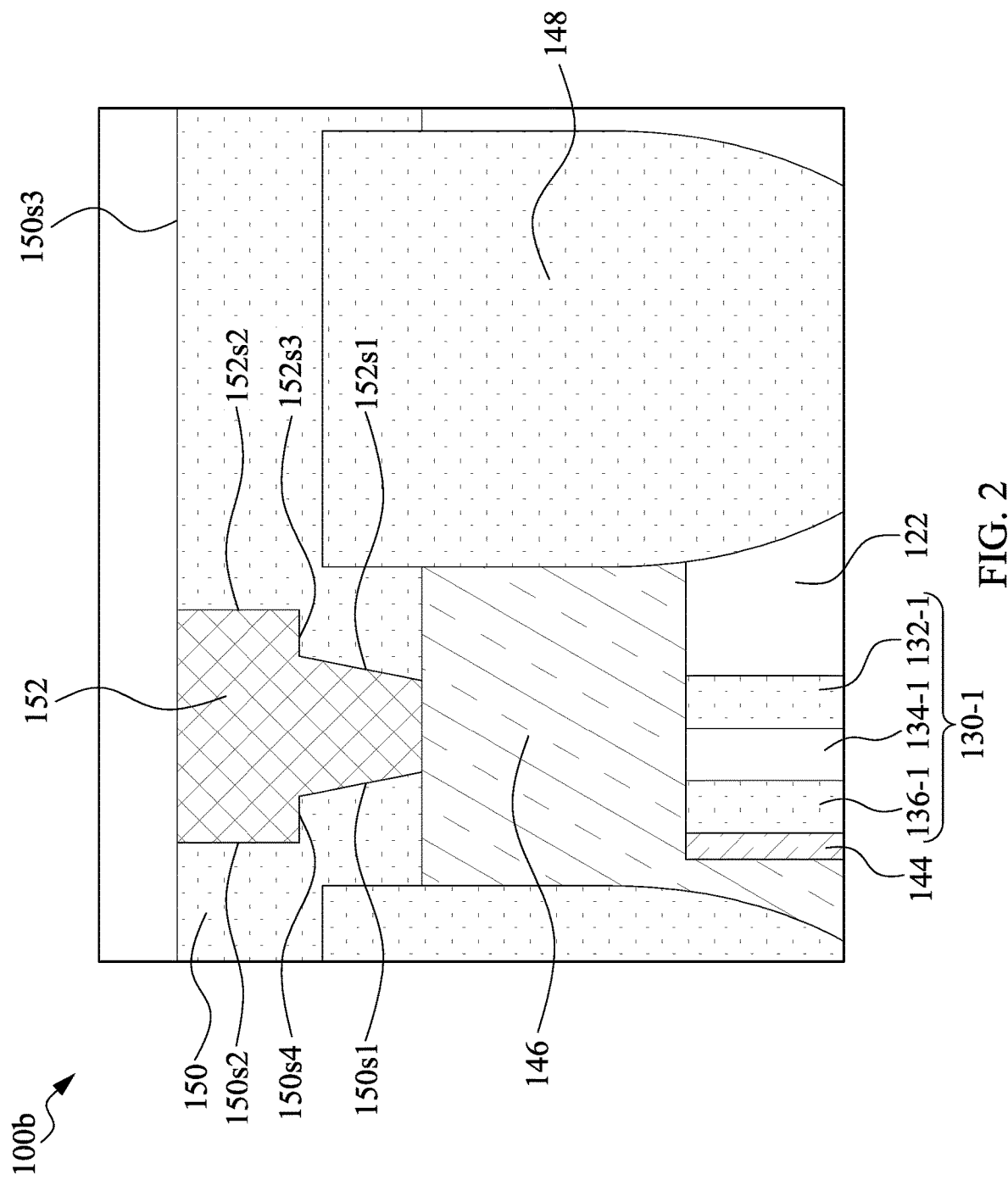
FIG. 2 is a cross-sectional view of a semiconductor device, in accordance with some embodiments of the present disclosure.

FIG. 2 is a cross-sectional view of a semiconductor device 100b, in accordance with some embodiments of the present disclosure. The semiconductor package structure 100b of FIG. 2 has a structure similar to that of the semiconductor package structure 100a of FIG. 1B with differences that the conductive wire 152 of the semiconductor device 100b further includes a surface 152s3 extending between the sidewalls 152s1 and 152s2 of the conductive wire 152.

In some embodiments, the overlay correction layer 150 can includes a surface 150s4 extending between the sidewalls 150s1 and 150s2 of the overlay correction layer 150. In some embodiments, the sidewall 150s2 and the surface 150s4 of the overlay correction layer 150 can define a recess vertically aligned with the landing pad 146, which improves the accuracy of a lithography process for determining the location of the conductive wire 152.

Figure 3A:
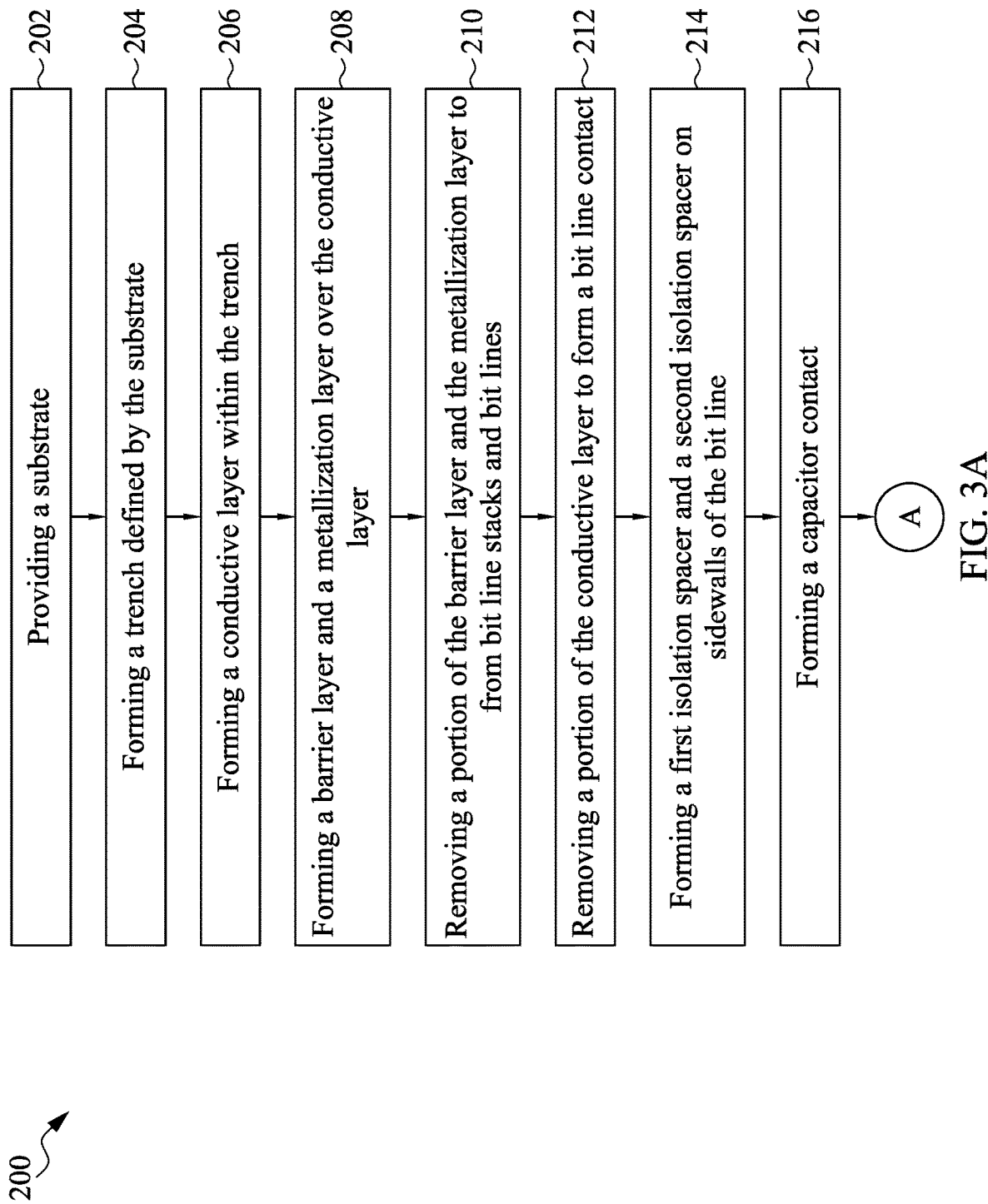
FIG. 3A is a flowchart illustrating a method of manufacturing a semiconductor device, in accordance with some embodiments of the present disclosure.
Figure 3B:
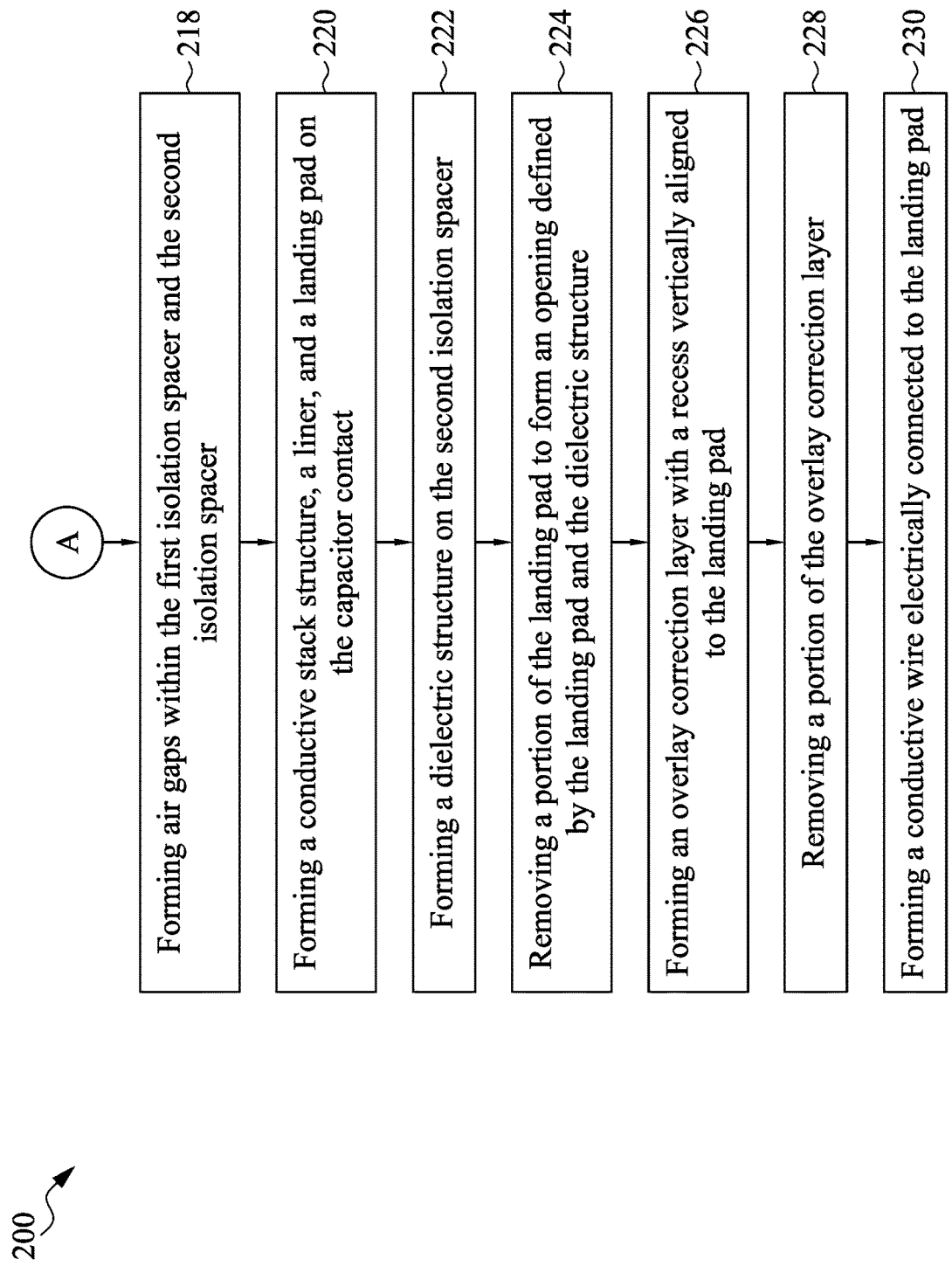
FIG. 3B is a flowchart illustrating a method of manufacturing a semiconductor device, in accordance with some embodiments of the present disclosure.

FIGS. 3A and 3B are flowcharts illustrating a method 200 of manufacturing a semiconductor device, in accordance with some embodiments of the present disclosure.

Referring to FIG. 3A, the method 200 begins with operation 202 in which a substrate is provided. In some embodiments, the substrate can include a plurality of active areas separated by isolation structures. A first dielectric layer can be formed on the substrate. In some embodiments, the substrate can cover the active area and the isolation structures. In some embodiments, a plurality of word lines can be formed within the substrate.

The method 200 continues with operation 204 in which a trench can be formed. In some embodiments, the trench can be formed by the etching process. In some embodiments, the trench can be recessed from the substrate. In some embodiments, the trench can be recessed from the first dielectric layer. In some embodiments, the trench can be defined by the first dielectric layer, the substrate, and the isolation structures.

The method 200 continues with operation 206 in which a conductive layer can be formed. In some embodiments, the conductive layer can fill the trench. In some embodiments, the conductive layer can be surrounded by the first dielectric layer.

The method 200 continues with operation 208 in which a barrier layer, a metallization layer, and a second dielectric layer can be formed. The barrier layer can cover the substrate. The metallization layer can be formed on the barrier layer. The second dielectric layer can be formed on the metallization layer.

The method 200 continues with operation 210 in which a portion of the metallization layer can be removed, thereby forming bit lines. In some embodiments, a portion of the barrier layer can be removed, thereby forming bit line stacks. In some embodiments, a portion of the barrier layer can be removed. Etching can be performed to remove the portion of the metallization layer, the barrier layer, and the second dielectric layer.

In some embodiments, a sidewall of the bit line can be exposed. In some embodiments, a sidewall of the bit line stack can be exposed. In some embodiments, a sidewall of the second dielectric layer can be exposed.

In some embodiments, a portion of the conductive layer can be exposed by the bit line stack. In some embodiments, the portion of the conductive layer can be exposed by the bit line. In some embodiments, the portion of the conductive layer can be exposed by the second dielectric layer.

In some embodiments, a portion of the bit lines can be disposed over the conductive layer. In some embodiments, a portion of the bit line stacks can be disposed over the conductive layer. In some embodiments, a portion of the bit lines can be disposed over the isolation structures. In some embodiments, a portion of the bit line stacks can be disposed over the isolation structures.

The method 200 continues with operation 212 in which a portion of the conductive layer is removed, thereby forming a bit line contact within the trench. In some embodiments, the portion of the conductive layer exposed by the bit line can be removed. In some embodiments, the portion of the conductive layer exposed by the second dielectric layer can be removed. The bit line can be tapered from the bit line toward the substrate.

The method 200 continues with operation 214 in which a first isolation spacer and a second isolation spacer can be formed. The first isolation spacer can be formed on a first side of the bit line. The second isolation spacer can be formed on a second side of the bit line. Each of the first isolation spacer and the second isolation spacer can have a multilayered structure. For example, each of the first isolation spacer and the second isolation spacer can have a structure made of silicon nitride/silicon oxide/silicon nitride.

The method 200 continues with operation 216 in which a capacitor contact can be formed. In some embodiments, an etching process can be performed to remove a portion of the substrate and the first dielectric layer to form a trench, and the capacitor contact can be formed within the said trench. In some embodiments, the capacitor contact can be formed between two of the bit lines. In some embodiments, the capacitor contact can be formed between the first isolation spacer and the second isolation spacer.

Referring to FIG. 3B, the method 200 continues with operation 218 in which an air gap can be formed within each of the first isolation spacer and the second isolation spacer. For example, silicon oxide layer of the first isolation spacer and the second isolation spacer can be removed, thereby forming air gaps. In some embodiments, the air gap can be spaced apart from the bit line by silicon nitride layer.

The method 200 continues with operation 220 in which a conductive stack structure, a liner, and a landing pad can be formed. In some embodiments, the conductive stack structure can be formed on a top surface of the capacitor contact.

In some embodiments, the liner can be formed on a top surface of the capacitor contact. In some embodiments, the liner can be formed on a sidewall of the first isolation spacer.

In some embodiments, the liner can be formed on a sidewall of the second isolation spacer.

In some embodiments, the landing pad can be formed on the liner. In some embodiments, the landing pad can be formed between two of the bit lines. In some embodiments, the landing pad can be formed between the first isolation spacer and the second isolation spacer. In some embodiments, the landing pad can cover a top surface the first isolation spacer. In some embodiments, the air gap of the first isolation spacer can be covered by the landing pad. In some embodiments, the landing pad can cover a top surface the second isolation spacer. In some embodiments, the air gap of the second isolation spacer can be covered by the landing pad.

The method 200 continues with operation 222 in which a dielectric structure can be formed. In some embodiments, a portion of the landing pad, liner, and first isolation spacer can be removed, which thereby forms an opening. The dielectric structure can be formed within the said opening. In some embodiments, the dielectric structure can be formed on the second isolation spacer. In some embodiments, the dielectric structure can be utilized to separate the landing pad. In some embodiments, a top surface of the dielectric structure can be coplanar with a top surface of the landing pad.

The method 200 continues with operation 224, a portion of the landing pad can be removed, and a recessed top surface of the landing pad can be formed. In some embodiments, the recessed top surface of the landing pad can be recessed from the top surface of the dielectric structure. In some embodiments, the recessed top surface of the landing pad can be non-coplanar with the top surface of the dielectric structure. In some embodiments, an opening can be defined by a lateral surface of the dielectric structure and the recessed top surface of the landing pad. In some embodiments, the lateral surface of the dielectric structure can be exposed from the dielectric structure.

The method 200 continues with operation 226 in which an overlay correction layer can be formed. In some embodiments, the overlay correction layer can be disposed on the top surface of the dielectric structure. In some embodiments, the overlay correction layer can be disposed on the lateral surface of the dielectric structure. In some embodiments, the overlay correction layer can be disposed on the top surface of the dielectric structure. In some embodiments, the overlay correction layer can fill the opening above the landing pad. In some embodiments, the overlay correction layer can form a first recess vertically aligned with the landing pad.

The recessed top surface and the top surface can define a stepped difference. The overlay correction layer can have a thickness, which, in some embodiments, can exceed the stepped difference. In some embodiments, the stepped difference of the overlay correction layer can range from about 0.03 times to about 0.5 times the thickness of the overlay correction layer, such as 0.03 times, 0.05 times, 0.1 times, 0.2 times, 0.3 times, 0.4 times, or 0.5 times. When the stepped difference ranges from about 0.03 times to about 0.5 times the thickness of the overlay correction layer, the first recess can be detected by machine (e.g., charge-coupled device (CCD)).

The method 200 continues with operation 228 in which a portion of the overlay correction layer can be removed. As a result, the recessed top surface of the landing pad can be exposed by the overlay correction layer. The overlay correction layer can have a first sidewall and a second sidewall. The first sidewall can extend from the recessed top surface of the landing pad. The second sidewall can be spaced apart from the landing pad by the first sidewall of the overlay correction layer. In some embodiments, the first sidewall of the overlay correction layer can be non-coplanar with the second sidewall of the overlay correction layer. In some embodiments, the second sidewall of the overlay correction layer can be steeper than the first sidewall of the overlay correction layer.

A second recess of the overlay correction layer can be formed. The second recess can have a first portion and a second portion. In some embodiments, the taper angle of the first portion of the overlay correction layer can be different from that of the second portion of the overlay correction layer. In some embodiments, the taper angle of the second portion of the overlay correction layer can exceed that of the first portion of the overlay correction layer. The first portion of the overlay correction layer can be defined by the first sidewall of the overlay correction layer. The second portion of the overlay correction layer can be defined by the second sidewall of the overlay correction layer.

The method 200 continues with operation 230 in which a conductive wire can be formed, which thereby produces the semiconductor device. In some embodiments, the conductive wire can be formed within the second recess of the overlay correction layer. The conductive wire can have a first sidewall and a second sidewall. The first sidewall of the conductive wire can extend from the recessed top surface of the landing pad. The second sidewall of the conductive wire can be spaced apart from the landing pad by the first sidewall of the conductive wire. In some embodiments, the first sidewall of the conductive wire can be non-coplanar with the second sidewall of the conductive wire. In some embodiments, the second sidewall of the conductive wire can be steeper than the first sidewall of the conductive wire.

The conductive wire can have a first portion and a second portion. In some embodiments, the taper angle of the first portion of the conductive wire can be different from the taper angle of the second portion of the conductive wire. In some embodiments, the taper angle of the second portion of the conductive wire can exceed the taper angle of the first portion of the conductive wire. The taper angle first portion can be defined by the first sidewall of the conductive wire. The taper angle second portion can be defined by the second sidewall of the conductive wire.

The overlay correction layer can assist in identification of the CCD during the lithography process, which can correct the overlay error between the overlay marks of the photosensitive material and the landing pad. As a result, the conductive wire can be vertically aligned with the landing pad, which thereby enhances device yield.

The method 200 is merely an example, and is not intended to limit the present disclosure beyond what is explicitly recited in the claims. Additional operations can be provided before, during, or after each operation of the method 200, and some operations described can be replaced, eliminated, or reordered for additional embodiments of the method. In some embodiments, the method 200 can include further operations not depicted in FIG. 3. In some embodiments, the method 200 can include one or more operations depicted in FIG. 3.

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N, and FIG. 4O illustrate one or more stages of an exemplary method for manufacturing a semiconductor device according to some embodiments of the present disclosure.

Figure 4A:
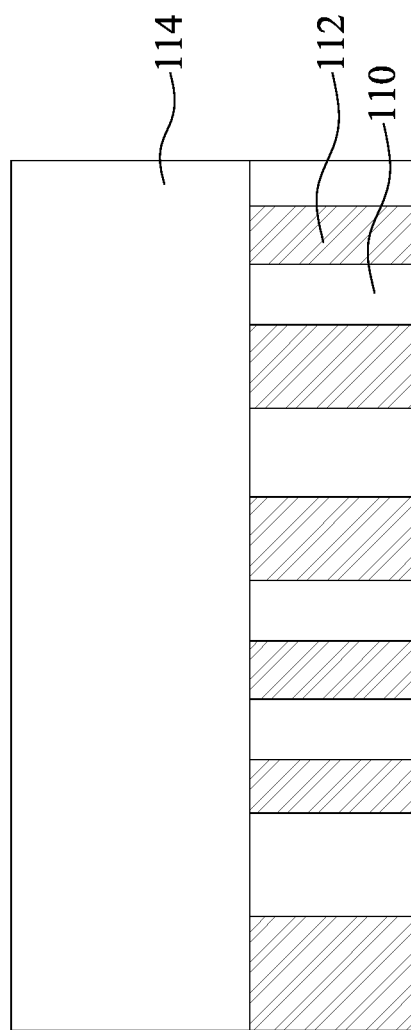
FIG. 4A illustrates one or more stages of an exemplary method for manufacturing a semiconductor device according to some embodiments of the present disclosure.

Referring to FIG. 4A, a substrate 110 is provided. In some embodiments, the substrate 110 can include a plurality of active areas separated by isolation structures 112. A dielectric layer 114 can be formed on the substrate 110. In some embodiments, the substrate 110 can cover the active area and the isolation structures 112.

Figure 4B:
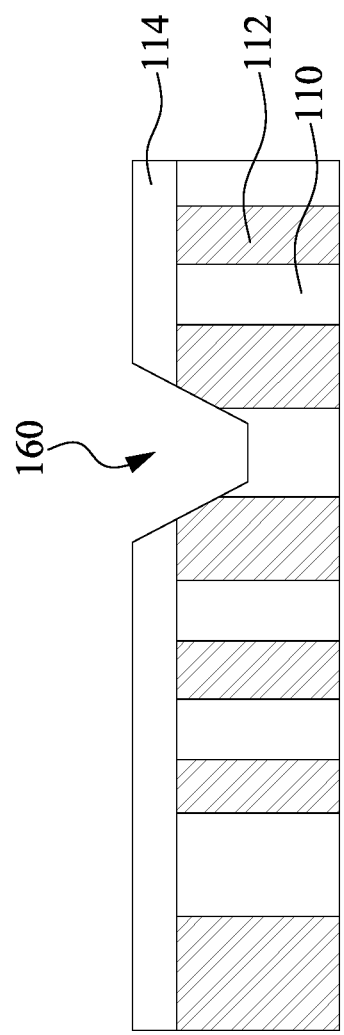
FIG. 4B illustrates one or more stages of an exemplary method for manufacturing a semiconductor device according to some embodiments of the present disclosure.

Referring to FIG. 4B, a trench 160 can be formed. In some embodiments, the trench 160 can be recessed from the substrate 110. In some embodiments, the trench 160 can be recessed from the dielectric layer 114. In some embodiments, the trench 160 can be defined by the dielectric layer 114, the substrate 110, and the isolation structures 112. In some embodiments, an etching process can be performed to form the trench 160. The etching process can include dry etching, wet etching, or other suitable process.

Figure 4C:
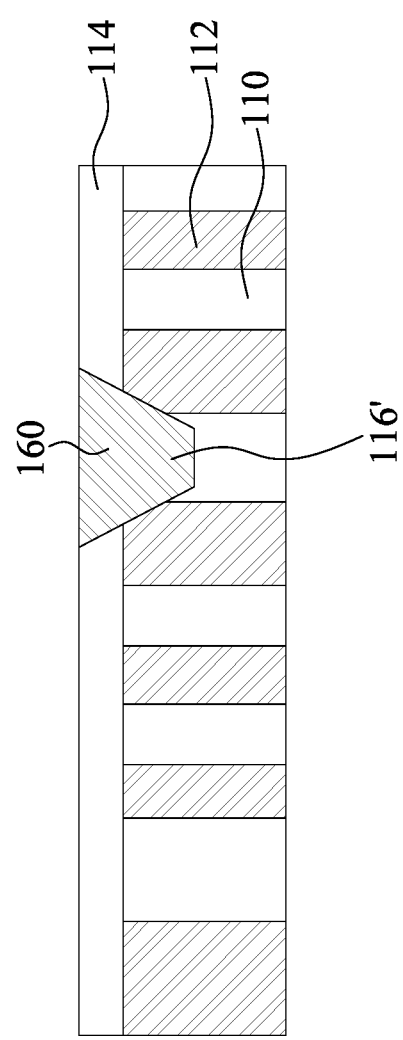
FIG. 4C illustrates one or more stages of an exemplary method for manufacturing a semiconductor device according to some embodiments of the present disclosure.

Referring to FIG. 4C, a conductive layer 116' can be formed. In some embodiments, the conductive layer 116' can fill the trench 160. In some embodiments, the conductive layer 116' can be surrounded by the dielectric layer 114. In some embodiments, the conductive layer 116' can be surrounded by the substrate 110. In some embodiments, the conductive layer 116' can be formed by chemical vapor deposition (CVD), atomic layer deposition (ALD), physical vapor deposition (PVD), low-pressure chemical vapor deposition (LPCVD), flowable chemical vapor deposition (FCVD), or other suitable process.

Figure 4D:
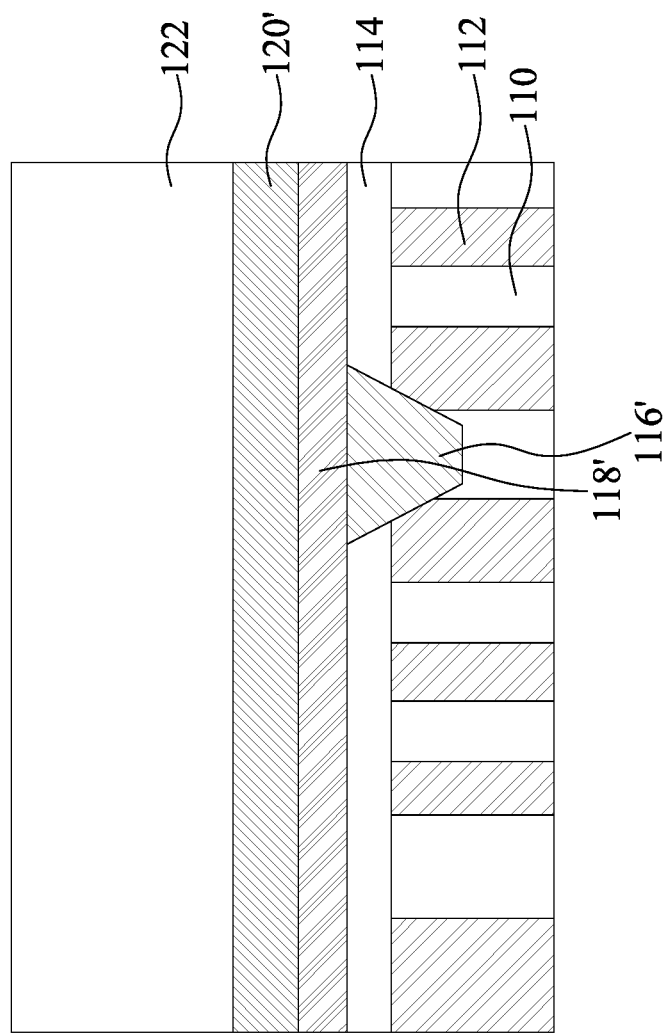
FIG. 4D illustrates one or more stages of an exemplary method for manufacturing a semiconductor device according to some embodiments of the present disclosure.

Referring to FIG. 4D, a barrier layer 118', a metallization layer 120', and a dielectric layer 122 can be formed. The barrier layer 118' can be formed by CVD, ALD, PVD, FCVD, LPCVD, or other suitable process. The metallization layer 120' can be formed on the barrier layer 118'. The metallization layer 120' can be formed by CVD, ALD, PVD, FCVD, LPCVD, or other suitable process. The dielectric layer 122 can be formed on the metallization layer 120'. The dielectric layer 122 can be formed by CVD, ALD, PVD, FCVD, LPCVD, or other suitable process.

In some embodiments, the barrier layer 118' can cover the substrate 110. In some embodiments, the barrier layer 118' can cover the dielectric layer 114.

In some embodiments, the metallization layer 120' can be configured to form bit line 120. In some embodiments, the metallization layer 120' can cover the barrier layer 118'.

In some embodiments, the dielectric layer 122 can cover the metallization layer 120'.

Figure 4E:
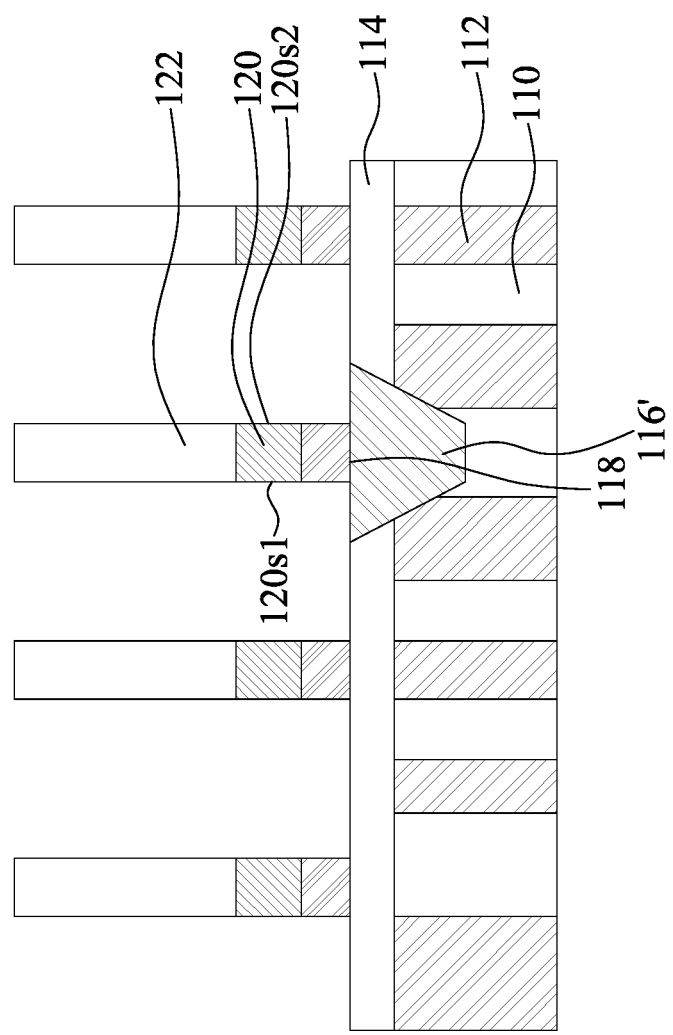
FIG. 4E illustrates one or more stages of an exemplary method for manufacturing a semiconductor device according to some embodiments of the present disclosure.

Referring to FIG. 4E, a portion of the metallization layer 120' can be removed, thereby forming bit lines 120. In some embodiments, a portion of the barrier layer 118' can be removed, thereby forming bit line stacks 118. In some embodiments, a portion of the dielectric layer 122 can be removed. An etching process can be performed to remove the portions of the metallization layer 120', the barrier layer 118', and the dielectric layer 122. The etching process can include dry etching, wet etching, or other suitable process.

In some embodiments, a sidewall 120$s$1 of the bit line 120 can be exposed. A sidewall 120$s$2 of the bit line 120 can be exposed. It should be noted that the each of the dielectric layer 122, the bit line 120, and the bit line stack 118 may have a circular profile, an elliptical profile, or the like from a top view, and the sidewall of the each of dielectric layer 122, the bit line 120, and the bit line stack 118 may refer to a lateral edge in a cross-section.

In some embodiments, a portion of the conductive layer 116' can be exposed by the bit line stack 118. In some embodiments, the portion of the conductive layer 116' can be exposed by the bit line 120. In some embodiments, the portion of the conductive layer 116' can be exposed by the dielectric layer 122.

In some embodiments, a portion of the bit lines 120 can be disposed over the conductive layer 116'. In some embodiments, a portion of the bit line stacks 118 can be disposed over the conductive layer 116'. In some embodiments, a portion of the bit lines 120 can be disposed over the isolation structures 112. In some embodiments, a portion of the bit line stacks 118 can be disposed over the isolation structures 112.

Figure 4F:
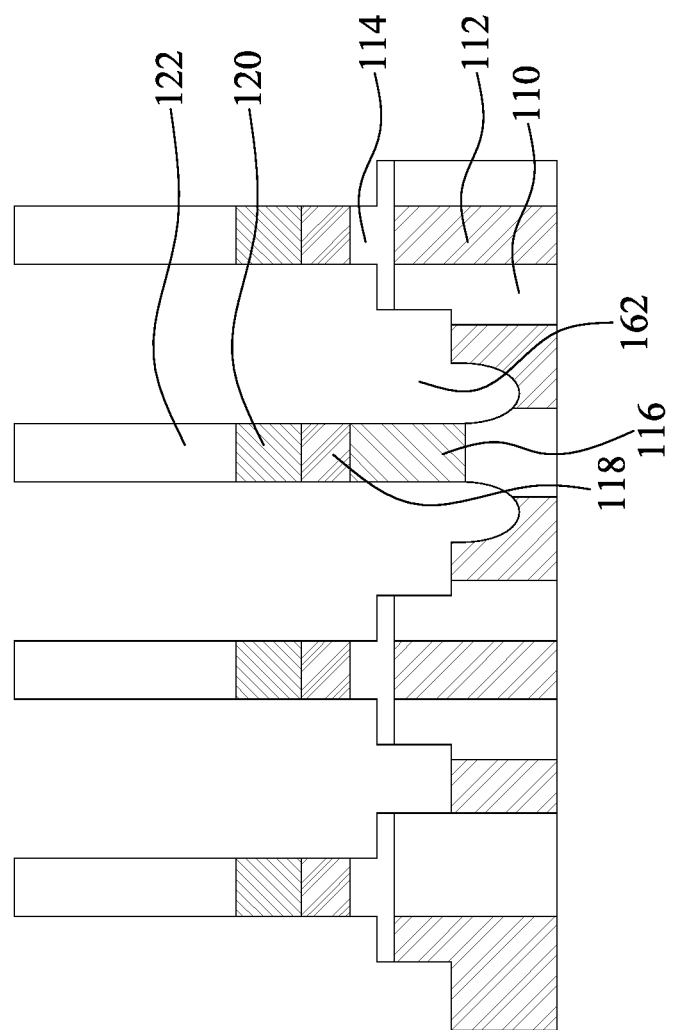
FIG. 4F illustrates one or more stages of an exemplary method for manufacturing a semiconductor device according to some embodiments of the present disclosure.

Referring to FIG. 4F, a portion of the conductive layer 116' is removed, thereby forming a bit line contact 116 within the trench 162. In some embodiments, the portion of the conductive layer 116' exposed by the bit line 120 can be removed. In some embodiments, the portion of the conductive layer 116' exposed by the bit line stack 118 can be removed. In some embodiments, the portion of the conductive layer 116' exposed by the dielectric layer 122 can be removed. The bit line 116 can be tapered along a direction from the bit line 120 toward the substrate 110.

Figure 4G:
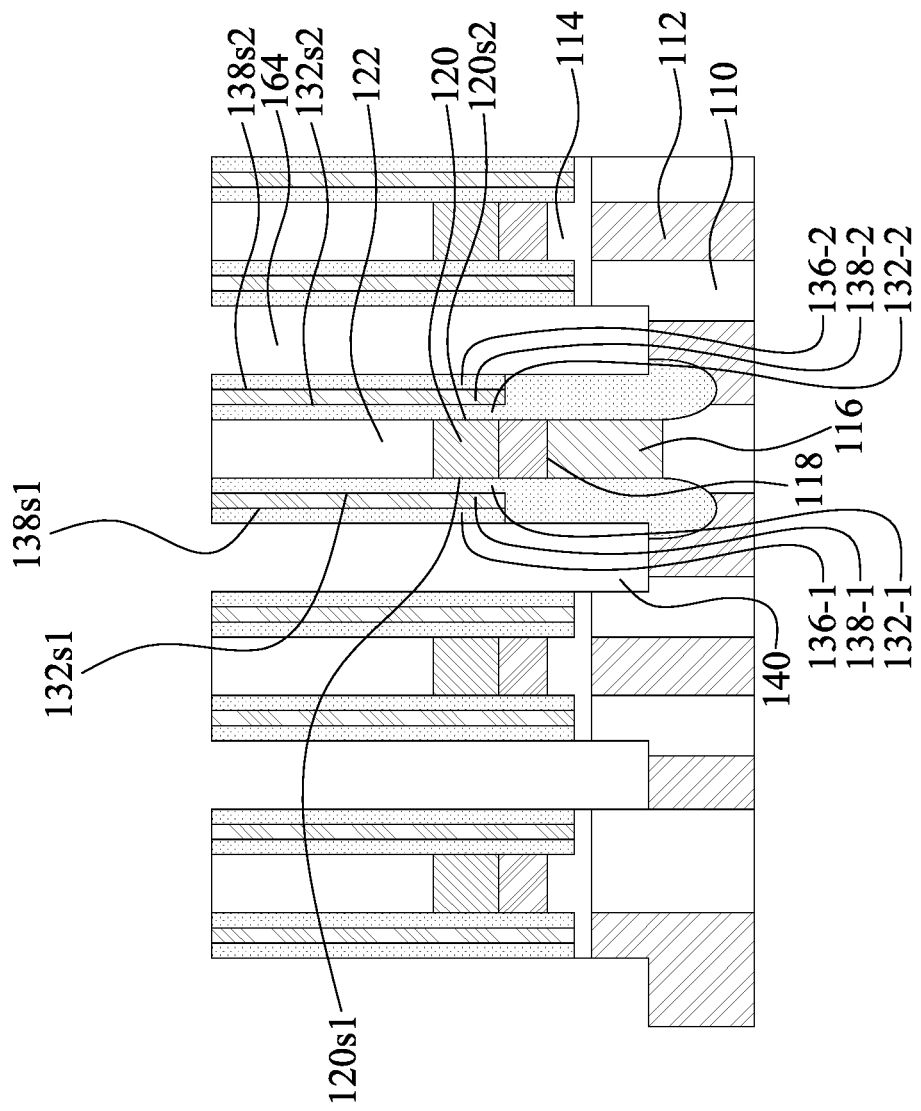
FIG. 4G illustrates one or more stages of an exemplary method for manufacturing a semiconductor device according to some embodiments of the present disclosure.

Referring to FIG. 4G, dielectric layers 132-1, 132-2, 138-1, 138-2, 136-1, and 136-2 can be formed. In some embodiments, the dielectric layers 132-1 and 132-2 can be formed on the sidewalls of the bit line contact 116, the bit line stack 118, the bit line 120, and the dielectric layer 122. For example, the dielectric layer 132-1 can be formed on the sidewall 120$s$1 of the bit line 120, and the dielectric layer 132-2 can be formed on the sidewall of the bit line 120$s$2 of the bit line 120. In some embodiments, the dielectric layer 132-1 can be in contact with the sidewall 120$s$1 of the bit line 120. In some embodiments, the dielectric layer 132-2 can be in contact with the sidewall 120$s$2 of the bit line 120. It should be noted that the dielectric layer 132-1 and the dielectric layer 132-2 can be a part of an integral (or monolithic) structure, and said integral structure can have a circular profile, an elliptical profile, or the like from a top view.

In some embodiments, the dielectric layer 138-1 can be disposed on a sidewall 132$s$1 of the dielectric layer 132-1. In some embodiments, the dielectric layer 138-2 can be disposed on a sidewall 132$s$2 of the dielectric layer 132-2. It should be noted that the dielectric layers 138-1 and 138-2 can be a part of an integral (or monolithic) structure, and the said integral structure can have a circular profile, an elliptical profile, or the like from a top view.

In some embodiments, the dielectric layer 136-1 can be disposed on a sidewall 138$s$1 of the dielectric layer 138-1. In some embodiments, the dielectric layer 136-2 can be disposed on a sidewall 138$s$2 of the dielectric layer 138-2. In some embodiments, the dielectric layer 136-1 can be spaced apart from the dielectric layer 132-1 by the dielectric layer 138-1. In some embodiments, the dielectric layer 136-2 can be spaced apart from the dielectric layer 132-2 by the dielectric layer 138-2. It should be noted that the dielectric layers 136-1 and 136-2 can be a part of an integral (or monolithic) structure, and the said integral structure can have a circular profile, an elliptical profile, or the like from a top view.

In some embodiments, the dielectric layer 138-1 can be a material different from the dielectric layers 132-1 and 136-1. In some embodiments, the dielectric layer 132-1 can be a material the same as that of the dielectric layer 136-1. In some embodiments, the dielectric layer 138-2 can be a material different from the dielectric layers 132-2 and 136-2. In some embodiments, the dielectric layer 132-2 can be a material the same as that of the dielectric layer 136-2. A trench 164 can be defined between the dielectric layers 136-1 and 136-2. The profiles of the dielectric layers 132-1, 132-2, 138-1, 138-2, 136-1, and 136-2 can be modified by suitable etching processes, and the present disclosure is not intended to be limiting.

Figure 4H:
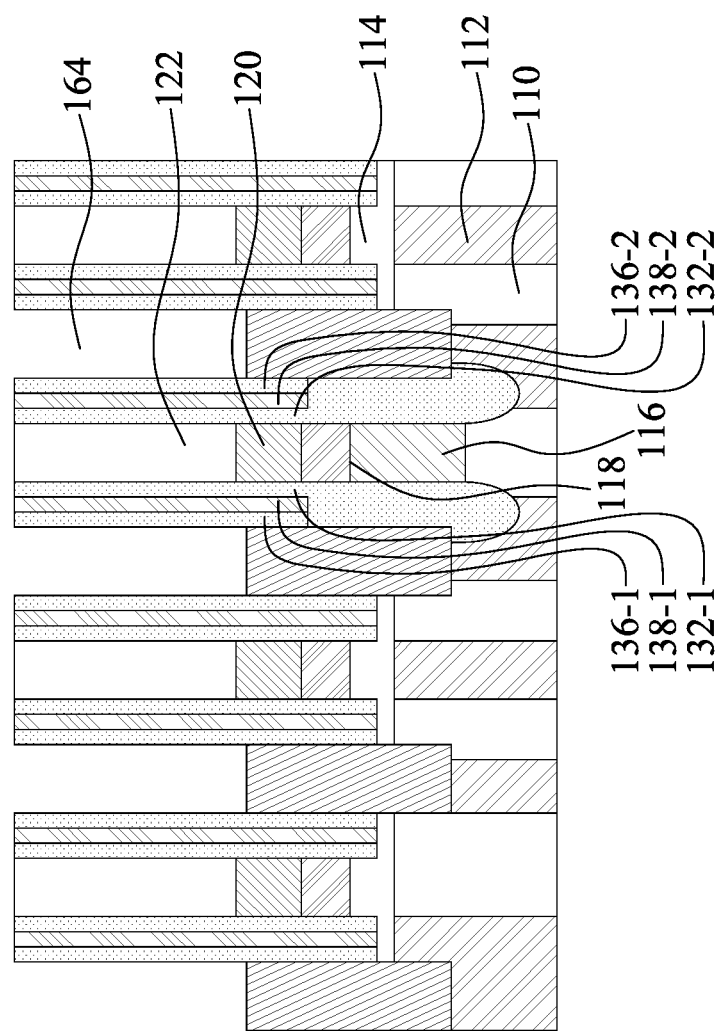
FIG. 4H illustrates one or more stages of an exemplary method for manufacturing a semiconductor device according to some embodiments of the present disclosure.

Referring to FIG. 4H, a capacitor contact 140 can be formed. The capacitor contact 140 can be formed within the trench 164. The capacitor contact 140 can be formed by, for example, CVD, ALD, PVD, FCVD, LPCVD, or other suitable process. In some embodiments, the capacitor contact 140 can be formed between two of the bit lines 120. In some embodiments, the capacitor contact 140 can be formed between the dielectric layers 136-1 and 136-2.

Figure 4I:
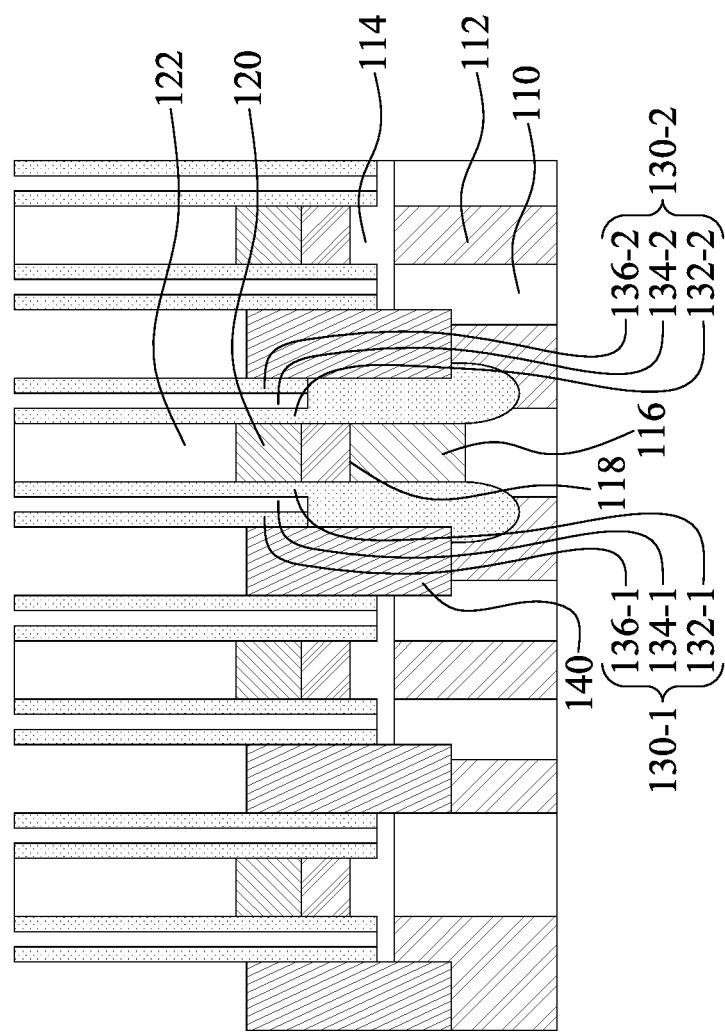
FIG. 4I illustrates one or more stages of an exemplary method for manufacturing a semiconductor device according to some embodiments of the present disclosure.

Referring to FIG. 4I, the dielectric layer 138-1 can be removed, which thereby forms an air gap 134-1. The dielectric layer 138-2 can be removed, which thereby forms an air gap 134-2. As a result, isolation spacers 130-1 and 130-2 can be produced. In some embodiments, the air gap 134-1 can be spaced apart from the bit line 120 by the dielectric layer 132-1. In some embodiments, the air gap 134-2 can be spaced apart from the bit line 120 by the dielectric layer 132-2. The dielectric layer 138-1 and dielectric layer 138-2 can be removed by an etching process, such as dry etching, wet etching, or other suitable process.

Figure 4J:
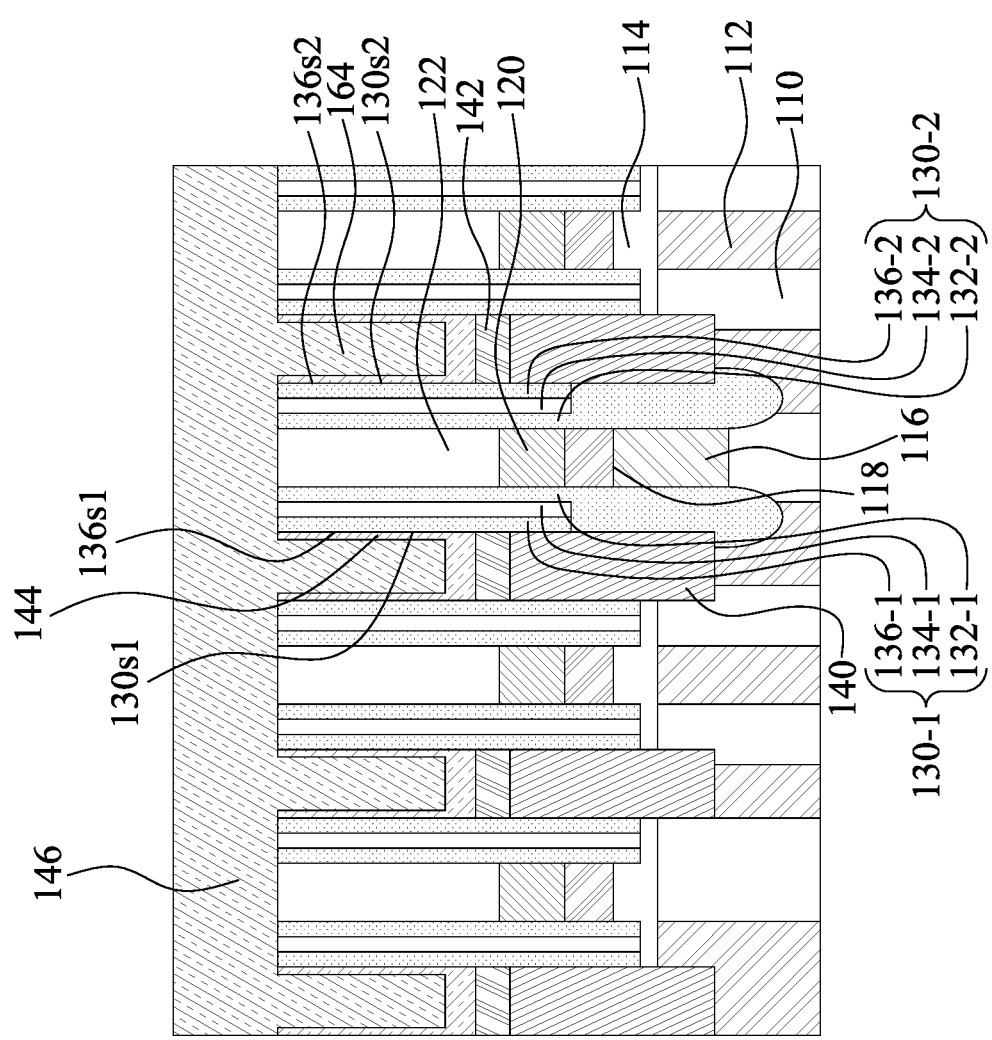
FIG. 4J illustrates one or more stages of an exemplary method for manufacturing a semiconductor device according to some embodiments of the present disclosure.

Referring to FIG. 4J, a conductive stack structure 142, a liner 144, and a landing pad 146 can be formed. The conductive stack structure 142 can be formed within the trench 160. In some embodiments, the conductive stack structure 142 can be formed on a top surface of the capacitor contact 140. In some embodiments, the conductive stack structure 142 can be formed between the dielectric layers 136-1 and 136-2.

In some embodiments, the liner 144 can be formed on a top surface of the capacitor contact 140. In some embodiments, the liner 144 can be formed on a sidewall 130$s$1 of the isolation spacer 130-1. In some embodiments, the liner 144 can be formed on a sidewall 136$s$1 of the dielectric layer 136-1. In some embodiments, the liner 144 can be formed on a sidewall of the isolation spacer 130-2. In some embodiments, the liner 144 can be formed on a sidewall 136$s$2 of the dielectric layer 136-2.

In some embodiments, the landing pad 146 can be formed on the liner 144. In some embodiments, the landing pad 146 can be formed between two bit lines 120. In some embodiments, the landing pad 146 can be formed between the isolation spacers 130-1 and 130-2. In some embodiments, the landing pad 146 can cover a top surface of the isolation spacer 130-1. In some embodiments, the landing pad 146 can cover a top surface of the dielectric layer 132-1. In some embodiments, the landing pad 146 can cover a top surface of the dielectric layer 136-1. In some embodiments, the air gap 134-1 can be covered by the landing pad 146. In some embodiments, the landing pad 146 can cover a top surface the isolation spacer 130-2. In some embodiments, the landing pad 146 can cover a top surface of the dielectric layer 132-2. In some embodiments, the landing pad 146 can cover a top surface of the dielectric layer 136-2. In some embodiments, the air gap 134-2 can be covered by the landing pad 146. In some embodiments, the landing pad 146 can cover a top surface of the dielectric layer 122. In some embodiments, the landing pad 146 can be formed within the trench 164 defined by the isolation spacers 130-1 and 130-2.

Figure 4K:
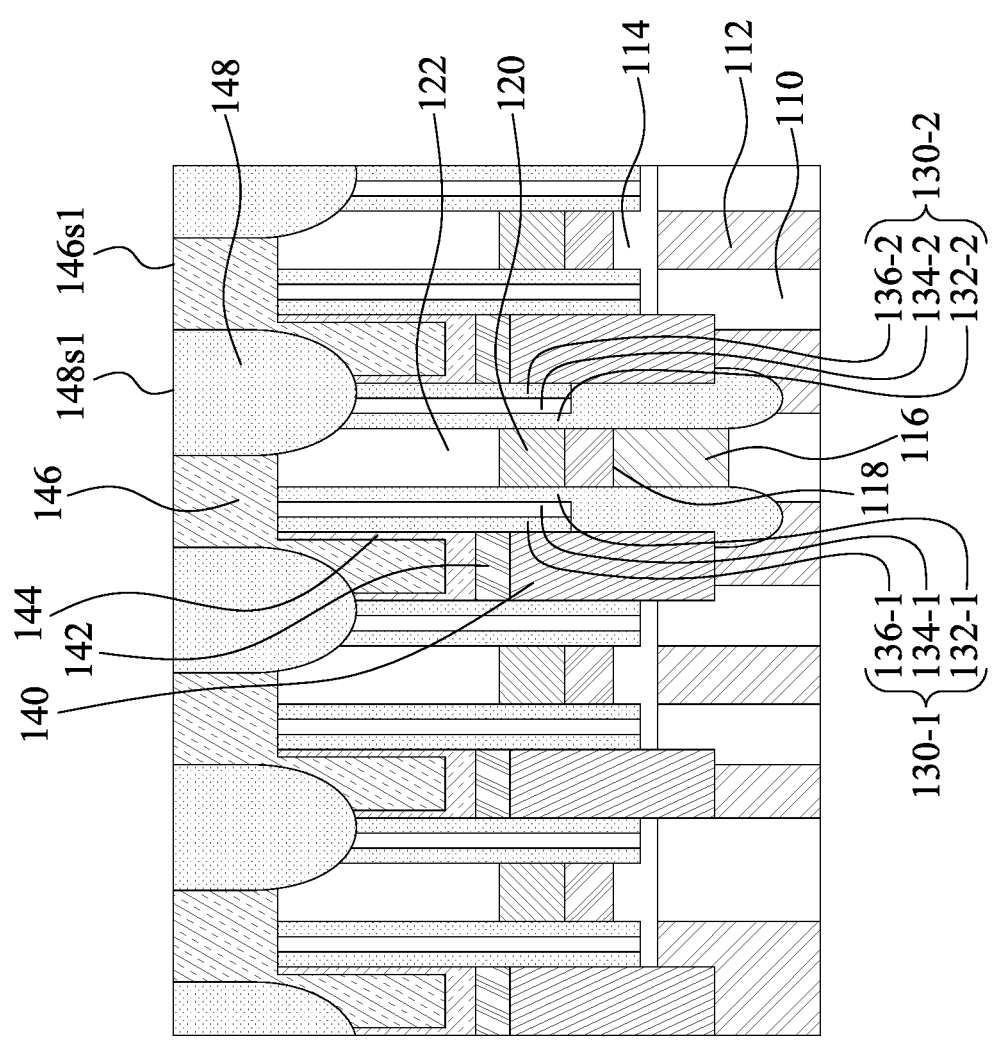
FIG. 4K illustrates one or more stages of an exemplary method for manufacturing a semiconductor device according to some embodiments of the present disclosure.

Referring to FIG. 4K, a dielectric structure 148 can be formed. In some embodiments, a portion of the landing pad 146, liner 144, and isolation spacer 130-2 can be removed, which thereby forms an opening. As a result, a length of the isolation spacer 130-1 can be different from the isolation spacer 130-2. In some embodiments, a length of the dielectric layer 132-1 can be different from the dielectric layer 132-2. In some embodiments, a length of the air gap 132-1 can be different from the air gap 132-2. In some embodiments, a length of the dielectric layer 136-1 can be different from the dielectric layer 136-2. The dielectric structure 148 can be formed within the openings. In some embodiments, the dielectric structure 148 can be formed on the isolation spacer 130-2. In some embodiments, the dielectric structure 148 can be utilized to separate the landing pads 146. The dielectric structure 148 can be formed by, for example, CVD, ALD, PVD, FCVD, LPCVD, or other suitable process. In some embodiments, a chemical mechanical polishing (CMP) process can be performed. In some embodiments, a surface 148$s$1 of the dielectric structure 148 can be coplanar with a surface 146$s$1 of the landing pad 146.

Figure 4L:
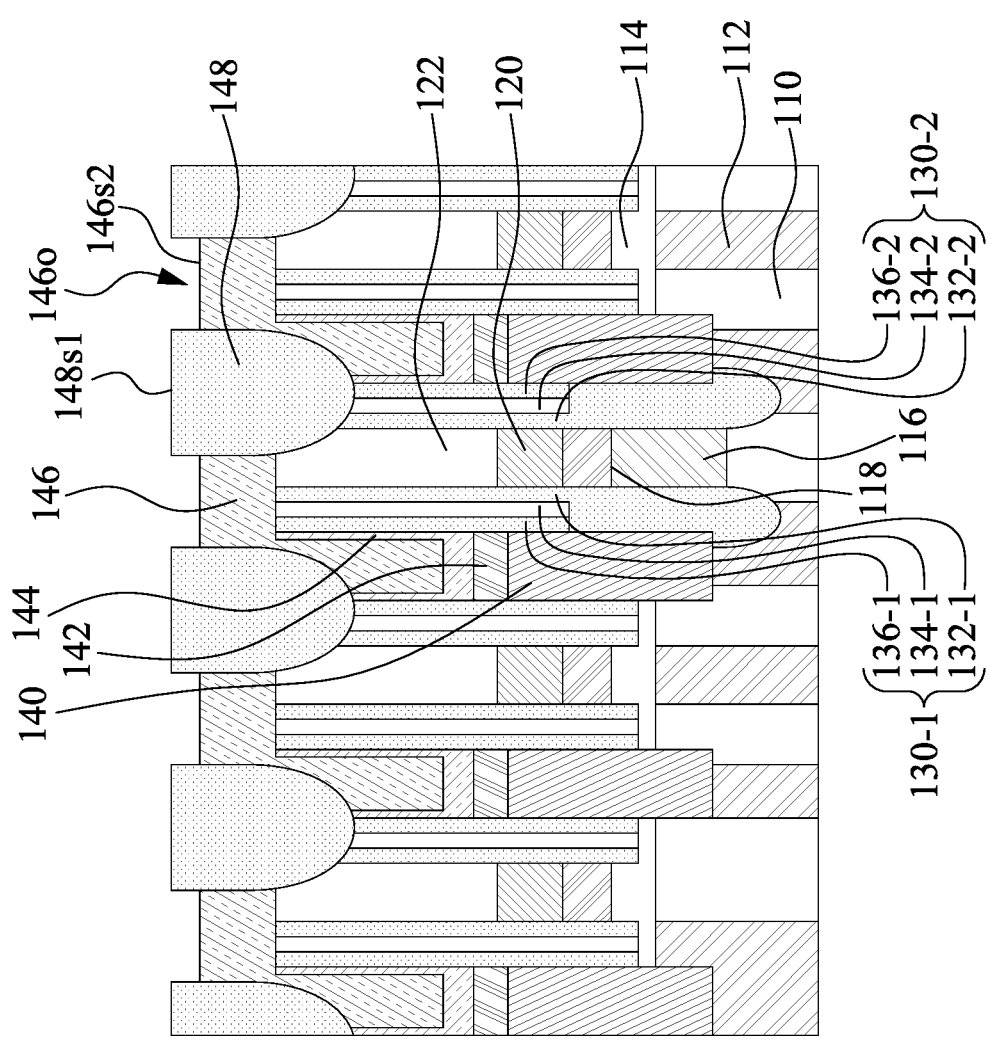
FIG. 4L illustrates one or more stages of an exemplary method for manufacturing a semiconductor device according to some embodiments of the present disclosure.

Referring to FIG. 4L, a portion of the landing pad 146 can be removed, and a surface 146$s$2 of the landing pad 146 can be formed. In some embodiments, the surface 146$s$2 of the landing pad 146 can be recessed from the surface 148$s$1 of the dielectric structure 148. In some embodiments, the surface 146$s$2 of the landing pad 146 can be non-coplanar with the surface 148$s$1 of the dielectric structure 148. In some embodiments, an opening 146$o$ (or recess) can be formed. The opening 146$o$ can be defined by a surface 148$s$2 of the dielectric structure 148 and the surface 146$s$2 of the landing pad 146.

Figure 4M:
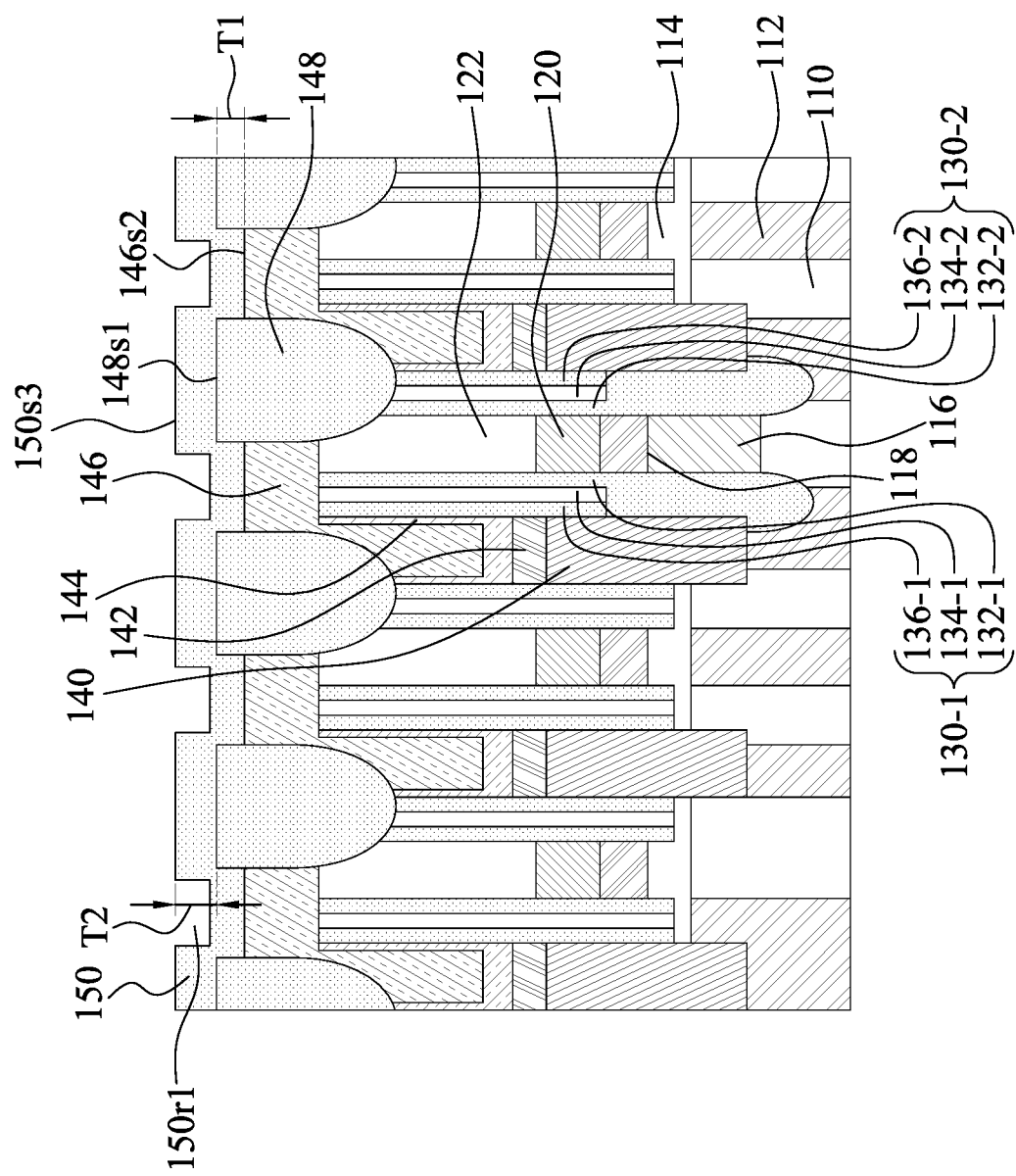
FIG. 4M illustrates one or more stages of an exemplary method for manufacturing a semiconductor device according to some embodiments of the present disclosure.

Referring to FIG. 4M, an overlay correction layer 150 can be formed. In some embodiments, the overlay correction layer 150 can be disposed on the surface 148$s$1 of the dielectric structure 148. In some embodiments, the overlay correction layer 150 can be disposed on the surface 146$s$2 of the dielectric structure 148. In some embodiments, the overlay correction layer 150 can fill the opening 146$o$ of the landing pad 146. In some embodiments, the overlay correction layer 150 can form a recess 150$r$1 recessed from a surface 150$s$3 of the overlay correction layer 150. In some embodiments, the recess 150$r$1 of the overlay correction layer 150 can be vertically aligned with the landing pad 146.

The surface 146$s$2 of the landing pad 146 and the surface 148$s$1 of the dielectric structure 148 can define a stepped difference T1. The overlay correction layer 150 can have a thickness T2 defined by the surface 150$s$3 of the overlay correction layer 150 and the surface 148$s$1 of the dielectric structure 148. In some embodiments, the thickness T2 can exceed the stepped difference T1. In some embodiments, the stepped difference T1 can range from about 0.03 times to about 0.5 times the thickness T2, such as 0.03 times, 0.05 times, 0.1 times, 0.2 times, 0.3 times, 0.4 times, or 0.5 times. When the stepped difference T1 range from about 0.03 times to about 0.5 times the thickness T2, the recess 150$r$1 can be detected by machine (e.g., charge-coupled device (CCD)) utilized in a photolithography process, which thereby assists in patterning the overlay correction layer 150 in a desired location.

Figure 4N:
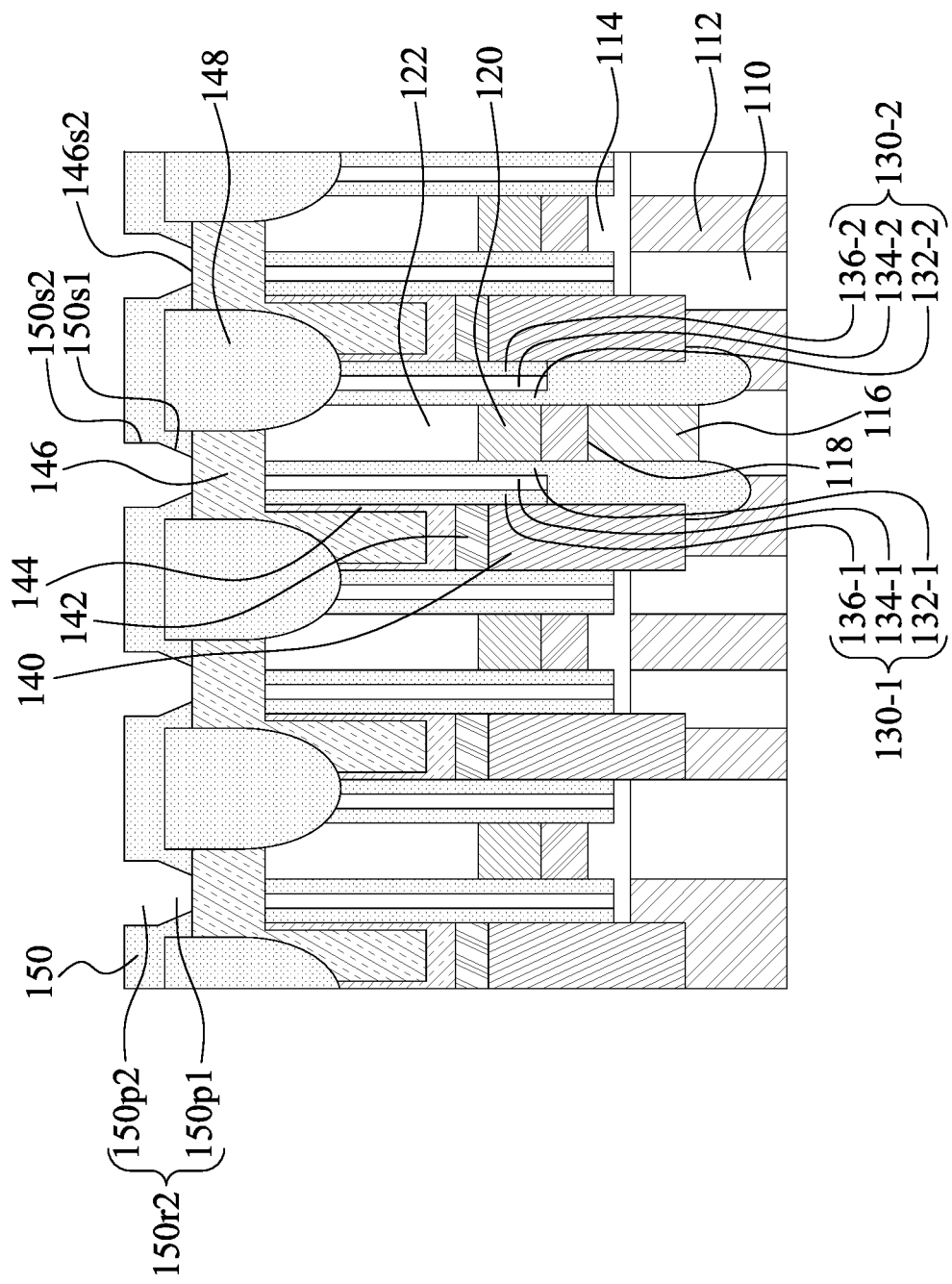
FIG. 4N illustrates one or more stages of an exemplary method for manufacturing a semiconductor device according to some embodiments of the present disclosure.

Referring to FIG. 4N, a portion of the overlay correction layer 150 can be removed. As a result, the surface 146$s$2 of the landing pad 146 can be exposed by the overlay correction layer 150. The overlay correction layer 150 can have a sidewall 150$s$1 and a sidewall 150$s$2. The sidewall 150$s$1 can extend from the surface 146$s$2 of the landing pad 146. The sidewall 150$s$2 can be spaced apart from the landing pad 146 by the sidewall 150$s$1 of the overlay correction layer 150. In some embodiments, the sidewall 150$s$1 of the overlay correction layer 150 can be non-coplanar with the sidewall 150$s$2 of the overlay correction layer 150. In some embodiments, the sidewall 150$s$2 of the overlay correction layer 150 can be steeper than the sidewall 150$s$1 of the overlay correction layer 150.

A recess 150$r$2 can be formed. The recess 150$r$2 can have a portion 150$p$1 and a portion 150$p$2. In some embodiments, the taper angle of the portion 150$p$1 can be different from the taper angle of the portion 150p2. In some embodiments, the taper angle of the portion 150p2 can exceed the taper angle of the portion 150p1. The portion 150p1 can be defined by the sidewall 150s1 of the overlay correction layer 150. The portion 150p2 can be defined by the sidewall 150s2 of the overlay correction layer 150.

In some embodiments, a lithography process can be performed to define a desired pattern of a photosensitive material (not shown) over the overlay correction layer 150. In some embodiments, the alignment of the pattern of the photosensitive material can depend on an overlay error between overlay marks (not shown) of the photosensitive material and the landing pad 146. In some cases, the overlay error between the overlay marks of the photosensitive material and the landing pad 146 may be relatively large, which may cause the recess 150r2 of the overlay correction layer 150 to be misaligned with the landing pad 146. In this embodiment, the recess 150r1 of the overlay correction layer 150 can assist in identification of the CCD during the lithography process, which can correct the overlay error between the overlay marks of the photosensitive material and the landing pad 146. As a result, the recess 150r2 can be vertically aligned with the landing pad 146.

Referring to FIG. 4O, a conductive wire 152 can be formed, which thereby produces the semiconductor device 100a. In some embodiments, the conductive wire 152 can be formed within the recess 150r2 of the overlay correction layer 150. The conductive wire 152 can have a sidewall 152s1 and a sidewall 152s2. The sidewall 152s1 can extend from the surface 146s2 of the landing pad 146. The sidewall 152s2 can be spaced apart from the landing pad 146 by the sidewall 152s1 of the conductive wire 152. In some embodiments, the sidewall 152s1 of the conductive wire 152 can be non-coplanar with the sidewall 152s2 of the conductive wire 152. In some embodiments, the sidewall 152s2 of the conductive wire 152 can be steeper than the sidewall 152s1 of the conductive wire 152.

The conductive wire 152 can have a portion 152p1 and a portion 152p2. In some embodiments, the taper angle of the portion 152p1 can be different from the taper angle of the portion 152p2. In some embodiments, the taper angle of the portion 152p2 can exceed the taper angle of the portion 152p1. The taper angle portion 152p1 can be defined by the sidewall 150s1 of the overlay correction layer 150. The taper angle portion 152p2 can be defined by the sidewall 150s2 of the overlay correction layer 150.

In a comparative semiconductor device, the top surface of the landing pad is not recessed from the top surface of the dielectric structure. When the overlay error between the lithography processes for determining the location of the conductive wire is relatively large, the conductive wire may be vertically misaligned with the landing pad, which may cause material of the conductive wire to fill the air gap of the isolation spacer and negatively affect the electrical parameter of the comparative semiconductor device. As described, the overlay correction layer 150 can assist in identification of the CCD during the lithography process, which can correct the overlay error between the overlay marks of the photosensitive material and the landing pad 146. As a result, the conductive wire 152 can be vertically aligned with the landing pad 146, which thereby enhances the yield of manufacturing the semiconductor device 100a.

One aspect of the present disclosure provides a semiconductor device. The semiconductor device includes a substrate, a bit line, a first isolation spacer, a second isolation spacer, a capacitor contact, a landing pad, and a dielectric structure. The bit line is disposed on the substrate. The first isolation spacer is disposed on a first side of the bit line. The second isolation spacer is disposed on a second side of the bit line. The capacitor contact is disposed on the substrate and spaced apart from the bit line through the first isolation spacer. The landing pad is disposed on the first isolation spacer and electrically connected to the capacitor contact. The dielectric structure is disposed on the second isolation contact. A top surface of the dielectric structure is non-coplanar with a top surface of the landing pad.

Another aspect of the present disclosure provides another semiconductor device. The semiconductor device includes a substrate, a bit line, a first isolation spacer, a second isolation spacer, a capacitor contact, a landing pad, and a conductive wire. The bit line is disposed on the substrate. The first isolation spacer is disposed on a first side of the bit line. The second isolation spacer is disposed on a second side of the bit line. The capacitor contact is disposed on the substrate and spaced apart from the bit line through the first isolation spacer. The landing pad is disposed on the first isolation spacer and electrically connected to the capacitor contact. The conductive wire is electrically connected to the landing pad. The conductive wire has a first sidewall connected to the landing pad and a second sidewall spaced apart from the landing pad through the first sidewall. The first sidewall is non-coplanar with the second sidewall.

Another aspect of the present disclosure provides a method of manufacturing a semiconductor device. The method includes, providing a substrate, forming a bit line over the substrate, forming a first isolation spacer in a first side of the bit line and a second isolation spacer on a second side of the bit line, forming a capacitor contact on the substrate, wherein the capacitor contact is spaced apart from the bit line by the first isolation spacer, forming a landing pad on the capacitor contact and the first isolation spacer, forming a dielectric structure on the second isolation spacer, removing a portion of the landing pad to form a recess from a top surface of the landing pad, and forming a conductive wire on the landing pad.

The embodiments of the present disclosure illustrate a semiconductor device including a landing pad with a top surface recessed from a top surface of the dielectric structure. The overlay correction layer can cover the recessed top surface of the landing pad and define a recess aligned with the landing pad, which may assist in identification of the CCD during the lithography process. As a result, device yield can be enhanced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate;
   a bit line disposed on the substrate;
   a first isolation spacer disposed on a first side of the bit line;
   a second isolation spacer disposed on a second side of the bit line;
   a capacitor contact disposed on the substrate and spaced apart from the bit line through the first isolation spacer;
   a landing pad disposed on the first isolation spacer and electrically connected to the capacitor contact;
   a dielectric structure disposed on the second isolation spacer, and
   an overlay correction layer disposed on the dielectric structure and the landing pad;
   wherein a top surface of the dielectric structure is non-coplanar with a top surface of the landing pad;
   wherein the overlay correction layer defines a trench exposing the landing pad, and the overlay correction layer has a first sidewall extending from the landing pad and a second sidewall spaced apart from the landing pad through the first sidewall, and the first sidewall of the overlay correction layer is non-coplanar with the second sidewall of the overlay correction layer.

2. The semiconductor device of claim 1, wherein the second sidewall of the overlay correction layer is laterally free from overlapping the dielectric structure.

3. The semiconductor device of claim 1, wherein the second sidewall of the overlay correction layer is steeper than the first sidewall of the overlay correction layer.

4. The semiconductor device of claim 1, further comprising:
   a conductive wire disposed within the trench defined by the overlay correction layer.

5. The semiconductor device of claim 1, wherein the top surface of the dielectric structure and the top surface of the landing pad collectively define a stepped difference, and a thickness of the overlay correction layer is larger than the stepped difference.

6. The semiconductor device of claim 5, wherein the stepped difference ranges from about 0.03 times to about 0.5 times the thickness of the overlay correction layer.

7. The semiconductor device of claim 1, wherein the first isolation spacer comprises an air gap.

8. The semiconductor device of claim 1, wherein the overlay correction layer has a first top surface and a second top surface lower than the first top surface, and the second top surface of the correction layer extends between a first sidewall and a second sidewall of the overlay correction layer.

9. The semiconductor device of claim 8, wherein a conductive wire is in contact with the second top surface of the overlay correction layer.

10. A semiconductor device, comprising:
    a substrate;
    a bit line disposed on the substrate;
    a first isolation spacer disposed on a first side of the bit line;
    a second isolation spacer disposed on a second side of the bit line;
    a capacitor contact disposed on the substrate and spaced apart from the bit line through the first isolation spacer;
    a landing pad disposed on the first isolation spacer and electrically connected to the capacitor contact; and
    a conductive wire electrically connected to the landing pad,
    wherein the conductive wire has a first sidewall connected to the landing pad and a second sidewall spaced apart from the landing pad through the first sidewall, and the first sidewall is non-coplanar with the second sidewall;
    wherein the second sidewall of the conductive wire is steeper than the first sidewall of the conductive wire.

11. The semiconductor device of claim 10, wherein the conductive wire has a surface extending between the first sidewall and the second sidewall of the conductive wire.

12. The semiconductor device of claim 10, further comprising:
    a dielectric structure disposed on the second isolation spacer,
    wherein the dielectric structure and the landing pad collectively define a stepped difference.

13. The semiconductor device of claim 12, further comprising:
    an overlay correction layer disposed on the dielectric structure, wherein the overlay correction layer surrounds the conductive wire;
    wherein the overlay correction layer has a first sidewall extending from the landing pad and a second sidewall spaced apart from the landing pad through the first sidewall, and the first sidewall of the overlay correction layer is non-coplanar with the second sidewall of the overlay correction layer.

14. The semiconductor device of claim 13, wherein the overlay correction layer has a first top surface and a second top surface lower than the first top surface, and the second top surface of the correction layer extends between the first sidewall and the second sidewall of the overlay correction layer, and the second sidewall of the overlay correction layer is steeper than the first sidewall of the overlay correction layer.

15. The semiconductor device of claim 13, wherein the overlay correction layer is in contact with a top surface of the landing pad.

16. The semiconductor device of claim 13, wherein the first isolation spacer comprises an air gap, and the conductive wire vertically overlaps the air gap of the first isolation spacer.

17. The semiconductor device of claim 13, wherein a thickness of the overlay correction layer is larger than the stepped difference between the dielectric structure and the landing pad.

* * * * *